(12) United States Patent
Ozawa

(10) Patent No.: US 6,384,646 B2
(45) Date of Patent: May 7, 2002

(54) SELECT SIGNAL GENERATING CIRCUIT HAVING CLAMP CIRCUIT FOR CLAMPING SELECT SIGNALS UPON POWER ON

(75) Inventor: Takashi Ozawa, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/814,878

(22) Filed: Mar. 23, 2001

(30) Foreign Application Priority Data

Nov. 6, 2000 (JP) .............................. 12-337459

(51) Int. Cl.$^7$ ................................. H03L 7/00
(52) U.S. Cl. ........................ 327/143; 327/198
(58) Field of Search .......................... 327/142, 296, 327/295, 180, 321, 198

(56) References Cited

U.S. PATENT DOCUMENTS 5,801,561 A * 9/1998 Wong et al. ............... 327/143
5,835,419 A * 11/1998 Ichimura et al. ......... 365/189.06

* cited by examiner

*Primary Examiner*—Kenneth B. Wells
*Assistant Examiner*—Cassandra Cox
(74) *Attorney, Agent, or Firm*—Arent Fox Kintner Plotkin & Kahn, PLLC

(57) ABSTRACT

A select signal generating circuit for preventing a malfunction and an increase in the circuit area is provided. The select signal generating circuit includes a select signal generator for generating a plurality of select output signals in accordance with a clock signal in response to a reset signal provided after a predetermined time passes since power on. A power-ON detection circuit detects the power-on, generates a power-ON detection signal, and maintains the power-ON detection signal until the reset signal is provided. The select signal generator includes a clamp circuit connected to the power-ON detection circuit for clamping the plurality of select output signals to predetermined levels in response to the power-ON detection signal.

11 Claims, 31 Drawing Sheets

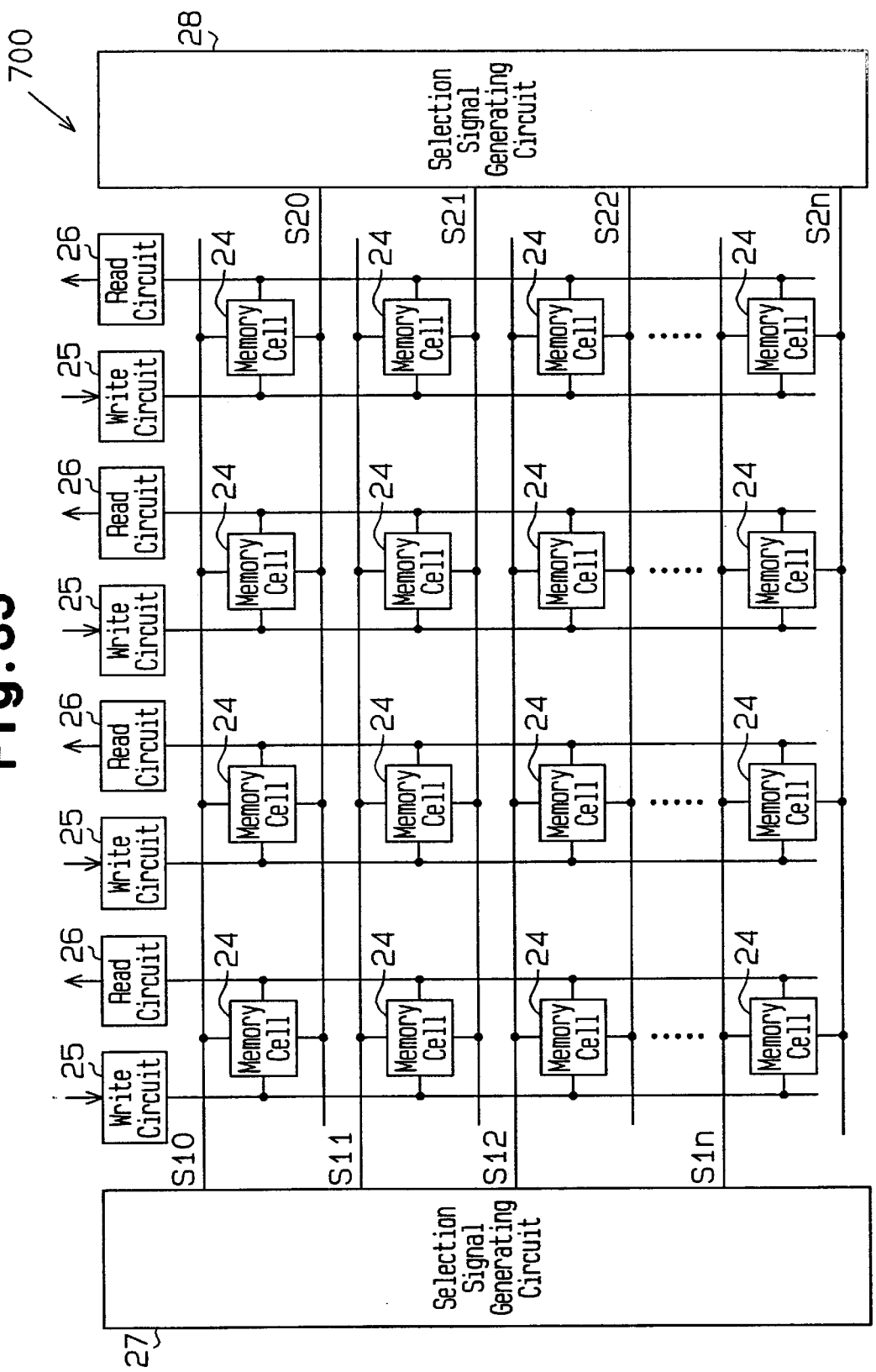

SELECT SIGNAL GENERATING CIRCUIT HAVING CLAMP CIRCUIT FOR CLAMPING SELECT SIGNALS UPON POWER ON

BACKGROUND OF THE INVENTION

The present invention relates to a select signal generating circuit in a semiconductor integrated circuit. More particularly, it relates to a select signal generating circuit, such as a shift register generating select signals for selecting one of plural bus lines or a pipeline processing circuit generating select signals for selecting a word line in a semiconductor memory device, in accordance with a clock signal.

FIG. 1 is a schematic circuit diagram of a first shift register 100 of the prior art. The shift register 100 generates select output signals Q0 to Q3 for selecting one of signal lines, such as bus lines, in accordance with complementary clock signals CK and XCK. FIG. 2 is a timing chart illustrating the operation of the shift register 100.

The shift register 100 includes a plurality of flip-flops each of which includes a master stage for generating a master output signal and a slave stage for generating a slave output signal. The shift register 100 is provided with a reset signal XR.

At the time power is provided to the shift register 100, master output signals MQ0 to MQ3, slave output signals SQ0 to SQ3 and the select output signals Q0–Q3 are unsettled.

In order to initialize the select output signals Q0–Q3, when the reset signal XR falls, the clock signal CK falls, and the clock signal XCK rises, the master stage is initialized, and the master output signal MQ3 rises. Subsequently, the clock signal CK rises, and the clock signal XCK falls. The slave stage and the select output signals Q0–Q3 are initialized, and only the select output signal Q3 rises. Thereafter, every time the clock signal CK rises, the select output signals Q0–Q3 rise in order.

The select output signals Q0–Q3 are unsettled until the reset signal XR is provided since power on. Therefore, simultaneous selection of a plurality of signal lines may cause a bus conflict. The bus conflict may cause the through current to flow between circuits that are connected together by the signal lines, thus deteriorating the system.

FIG. 3 is a schematic circuit diagram of a second shift register 120 which can reset the select output signals Q0–Q3 based on a power-ON detection signal G of the prior art. The power-ON detection signal G is generated by a power-ON detection circuit 140 shown in FIG. 4. FIG. 5 is a timing chart describing the operation of the power-on detection circuit 140 upon power on.

The power-ON detection circuit 140 includes inverter circuits 1a to 1g connected in series. A low-potential power supply Vss is connected to the input terminal of the first inverter circuit 1a, and the output signal of the last inverter circuit 1g is provided to a one-shot pulse generating circuit 2.

A capacitor C1 is connected between a node A, which locates between the inverter circuits 1a and 1b, and the low-potential power supply Vss. A capacitor C3 is connected between a node C, which locates between the inverter circuits 1c and 1d, and the low-potential power supply Vss. A capacitor C5 is connected between a node E, which locates between the inverter circuits 1e and 1f, and the low-potential power supply Vss. A capacitor C2 is connected between a node B, which locates between the inverter circuits 1b and 1c, and a high-potential power supply Vcc. A capacitor C4 is connected between a node D, which locates between the inverter circuits 1d and 1e, and a high-potential power supply Vcc.

When the supply voltage Vcc gradually rises as the supply voltages Vcc and Vss are given, with the node A kept at the level of the supply voltage Vss by the capacitor C1, the capacitor C1 is charged by the output signal of the inverter circuit 1a so that the voltage at the node A rises together with the supply voltage Vcc.

When the supply voltages Vcc and Vss are given, the voltage at the node B rises together with the supply voltage Vcc due to the capacitor C2. Thereafter, when the voltage at the node A rises, the output signal of the inverter circuit 1b is inverted so that the voltage at the node B falls toward a low level.

When the output signal of the inverter circuit 1c is inverted by the dropped voltage at the node B with the node C kept at the level of the supply voltage Vss by the capacitor C3, the capacitor C3 is charged so that the voltage at the node C rises toward a high level.

The voltage at the node D rises together with the supply voltage Vcc due to the capacitor C4. Thereafter, when the output signal of the inverter circuit 1d is inverted due to an increase in the voltage at the node C, the voltage at the node D falls toward a low level.

When the output signal of the inverter circuit 1e is inverted by the dropped voltage at the node D with the node E kept at the level of the supply voltage Vss by the capacitor C5, the capacitor C5 is charged so that the voltage at the node E rises toward a high level.

A node F rises to a high level after a predetermined delay time since power-on of the supply voltage Vcc. The predetermined delay time is determined by the time constant set by ON resistances of the inverter circuits 1a–1g and the capacitances C1–C5 and the rising speed of the supply voltage Vcc.

The one-shot pulse generating circuit 2 generates a one-shot pulse signal (the power-ON detection signal G) at a high level for a predetermined time in response to the rising of the node F.

After power on, when the power-ON detection signal G is provided to the shift register 120 prior to the reset signal XR, the master output signals MQ0–MQ3 and the slave output signals SQ0–SQ3 are reset.

As shown in FIG. 6, therefore, when the power-ON detection signal G is provided, only the master output signal MQ3 and the select output signal Q3 rise, and only the slave output signal SQ3 falls.

The timing of providing the power-ON detection signal G is determined by the time constant set by ON resistances of the inverter circuits 1a–1g and the capacitances C1–C5 and the through rate (rising speed) of the supply voltage Vcc. When the through rate of the supply voltage Vcc is larger than the speed expected at the time of designing the circuit, the power-ON detection signal G is provided to the shift register 120 before the supply voltage Vcc reaches a predetermined level. As a result, the reset operation is not carried out normally. This requires a certain restriction on the power-ON operation. If the power-ON operation lies off the certain restriction, the reset operation fails.

The shift register 120 has transfer gates opened and closed in accordance with the power-ON detection signal G, and charge/discharge circuits connected to the input terminals of latch circuits of the master stage and slave stage. This design inevitably increases the circuit area of the shift register 120 and increases the load capacitance to the latch circuits, thus lowering the operational speed of the shift register 120.

FIG. 7 is a schematic circuit diagram of a third shift register 160 which can reset the select output signals Q0–Q3 in accordance with a reset signal XR1 generated based on the power-ON detection signal of the prior art.

The shift register 160 has the same structure as the shift register 100 except that clock signals CK1 and XCK1 and the reset signal XR1 are provided to the shift register 160.

FIG. 8 is a schematic circuit diagram of a reset signal generating circuit 180 generating the clock signals CK1 and XCK1 and the reset signal XR1. The generating circuit 180 is provided with the clock signal CK, the reset signal XR and power-ON detection signals G and H. The power-ON detection signals G and H are generated by a power-ON detection circuit 200 shown in FIG. 9. FIG. 10 is a timing chart illustrating the operation of the power-ON detection circuit 200. The power-ON detection circuit 200 includes first and second one-shot pulse circuits 3a and 3b connected to the node F of the power-ON detection circuit 140 in FIG. 4.

The first one-shot pulse circuit 3a operates in the same way as the one-shot pulse generating circuit 2 of FIG. 4, thereby generating the power-ON detection signal G. The second one-shot pulse circuit 3b generates the one-shot pulse signal H which rises at the same time as the power-ON detection signal G and falls with a delay from the power-ON detection signal G.

When the power-ON detection signal G rises, the generating circuit 180 generates the clock signal CK1 at a low level irrespective of the level of the clock signal CK. When the power-ON detection signal H rises, the generating circuit 180 invalidates the clock signal CK and generates the reset signal XR1 at a high level irrespective of the level of the reset signal XR.

As shown in FIG. 11, first, the master output signals MQ0–MQ3 are reset in accordance with the low-level clock signal CK1, and the reset signal XR1 generated based on the power-ON detection signals G and H. Then, when the clock signal CK1 rises, the slave output signals SQ0–SQ3 and the select output signals (flip-flop output signals) Q0–Q3 are reset.

The shift register 160 performs the reset operation in accordance with the reset signal XR1 based on the power-ON detection signals G and H. This requires a certain restriction on the power-ON operation, as per the second prior art. If the power-ON operation comes off the certain restriction, the reset operation fails.

FIG. 12 is a schematic circuit diagram of a fourth shift register 220 of the prior art, and FIG. 13 is a timing chart illustrating the operation of the shift register 220.

The shift register 220 has master stages including output latch circuits ML0 to ML2 generating master output signals MQ0 to MQ2. The input terminal of a forward inverter circuit of each latch circuit is connected to the power supply Vcc via a capacitor C. The output terminal of the forward inverter circuit is connected to the power supply Vss via the capacitor C. Each forward inverter circuit includes an N channel MOS (NMOS) transistor and a P channel MOS (PMOS) transistor. The PMOS transistor has a smaller load driving capability than the NMOS transistor. Upon power on, therefore, the master output signals MQ0–MQ2 are reset to low levels.

The shift register 220 has another master stage including a latch circuit ML3 generating a master output signal MQ3. The input terminal of a forward inverter circuit of the latch circuit ML3 is connected to the power supply Vss via the capacitor C. The output terminal of the forward inverter circuit is connected to the power supply Vcc via the capacitor C.

The forward inverter circuit of the latch circuit ML3 includes an NMOS transistor and a PMOS transistor. The PMOS transistor has a greater load driving capability than the NMOS transistor. Upon power on, therefore, the master output signal MQ3 is reset to a high level.

The shift register 220 has slave stages including latch circuits SL0 to SL2, which generate slave output signals SQ0 to SQ2. The input terminal of a forward inverter circuit of each slave stage is connected to the power supply Vss via the capacitor C. The output terminal of the forward inverter circuit is connected to the power supply Vcc via the capacitor C. Each forward inverter circuit includes an NMOS transistor and a PMOS transistor. The PMOS transistor has a larger load driving capability than the NMOS transistor. Upon power on, therefore, the slave output signals SQ0–SQ2 are reset to high levels.

The shift register 220 has another slave stage including a latch circuit SL3, which generates a slave output signal SQ3. The input terminal of a forward inverter circuit of the latch circuit SL3 is connected to the power supply Vcc via the capacitor C. The output terminal of the forward inverter circuit is connected to the power supply Vss via the capacitor C. The forward inverter circuit of the latch circuit SL3 includes an NMOS transistor and a PMOS transistor. The PMOS transistor has a smaller load driving capability than the NMOS transistor. Upon power on, therefore, the master output signal SQ3 is reset to a low level.

With the above-described structure, when the shift register 220 is powered on, the shift register 220 executes the reset operation such that only the select output signal Q3 rises to a high level.

Capacitors are connected to the output terminals of the individual latch circuits of the master stages and slave stages of the shift register 220. This increases the circuit area of the shift register 220, and the load capacitance to each latch circuit increases in normal operation mode so that the operational speed of the shift register 220 falls.

FIG. 14 is a schematic circuit diagram of a first pipeline processing circuit 240 of the prior art. The pipeline processing circuit 240 generates select output signals Q0 to Q7 to select one of plural signal lines in accordance with the clock signal CK. The pipeline processing circuit 240 includes a counter 4, three flip-flop circuits 5a, a decoder 6 and eight flip-flop circuits 5b.

The counter 4 starts counting up counter output signals B0 to B2 every time the clock signal CK rises in response to the low-level reset signal XR. The counter output signals B0–B2 are respectively provided to the flip-flop circuits 5a, which supply latched output signals C0 to C2 to the decoder 6.

The decoder 6 decodes the 3-bit latched output signals C0–C2 and provides the 8-bit decoded output signals D0–D7, one of which is at a high level, to the flip-flop circuits 5b. The flip-flop circuits 5b receive the decoded output signals D0–D7 and output the select output signals Q0–Q7 in accordance with the clock signal CK.

As shown in FIG. 15, each flip-flop circuit 5a includes a master stage and a slave stage. Each of the master and slave stages includes a latch circuit. An input signal D is transferred to the master stage and to the slave stage in accordance with the clock signal CK, thus generating the latched output signal Q. Each flip-flop circuit 5b has the same structure as the flip-flop circuit 5a.

In the pipeline processing circuit 240, as shown in FIG. 16, when the clock signal CK rises to a high level with the low-level reset signal XR provided, the count-up operation of the counter 4 starts. In the count-up operation, every time the clock signal CK rises, the counter 4 outputs the counter output signals B0–B2.

In response to the rising of the clock signal CK, the three flip-flop circuits 5a latch the counter output signals B0–B2 and output the latched output signals C0–C2.

The decoder 6 decodes the latched output signals C0–C2 of the flip-flop circuits 5a and generates the decoded output signals D0–D7. In response to the rising of the clock signal CK, the eight flip-flop circuits 5b latch the decoded output signals D0–D7 and generate the select output signals Q0–Q7.

In the pipeline processing circuit 240, the counter output signals B0–B2, the latched output signals C0–C2, the decoded output signals D0–D7 and the select output signals Q0–Q7 are unsettled until the low-level reset signal XR is provided since power on. Further, the select output signals Q0–Q7 are unsettled until two periods of the clock signal CK pass after the reset signal XR has fallen to the low level. During the period in which the select output signals Q0–Q7 are unsettled, a plurality of signal lines is selected by the select output signals Q0–Q7, which may cause a bus conflict.

FIG. 17 is a schematic circuit diagram of a second pipeline processing circuit 260 of the prior art. The pipeline processing circuit 260 resets the select output signals Q0–Q7 in accordance with the power-ON detection signal G. The counter 4 and flip-flop circuits 7a and 7b are provided with the power-ON detection signal G from the power-ON detection circuit 140 of FIG. 4.

The counter 4 resets all of the counter output signals B0–B2 to zero (0) in response to the power-ON detection signal G.

In each flip-flop circuit 7a, as shown in FIG. 18, the latched output signal MQ0 of the master stage and the latched output signal SQ0 of the slave stage are both reset to high levels by the high-level power-ON detection signal G. Each flip-flop circuit 7b operates in the same way as the flip-flop circuit 7a. Therefore, the latched output signals C0–C2 of the flip-flop circuits 7a and the select output signals Q0–Q7 of the flip-flop circuits 7b are reset to low levels in accordance with the power-ON detection signal G.

In the pipeline processing circuit 260, as shown in FIG. 19, the counter output signals B0–B2 are all reset to zero in accordance with the power-ON detection signal G, thus resetting all of the latched output signals C0–C2 of the flip-flop circuits 7a to zero. The latched output signals C0–C2 reset all of the decoded output signals D0–D7 to zero, thus resetting all of the select output signals Q0–Q7 to zero.

Because the select output signals Q0–Q7 are all reset to zero after the power-ON detection signal G is provided, a bus conflict by multiple selection of signal lines is prevented.

Although the power-ON detection signal G is used in the pipeline processing circuit 260, a certain restriction is needed on the power-ON operation so that when the power-ON operation goes off the certain restriction, a failure occurs in the reset operation. Further, the number of components of the flip-flop circuits 7a and 7b increases, thereby increasing the circuit area of the pipeline processing circuit 260.

SUMMARY OF THE INVENTION

Accordingly, it is an object of the present invention to provide a select signal generating circuit that prevents a malfunction and an increase in the circuit area.

In one aspect of the present invention, a select signal generating circuit includes a select signal generator for generating a plurality of select output signals in accordance with a clock signal in response to a reset signal provided after a predetermined time passes since power on and a power-ON detection circuit for detecting the power-on, generating a power-ON detection signal and maintaining the power-ON detection signal until the reset signal is provided. The select signal generator includes a clamp circuit connected to the power-ON detection circuit for clamping the plurality of select output signals to predetermined levels in response to the power-ON detection signal.

In another aspect of the present invention, a select signal generating circuit includes a select signal generator for generating a plurality of select output signals in accordance with a clock signal in response to a reset signal provided after a predetermined time passes since power on and a power-ON detection circuit for detecting the power-on, generating a first power-ON detection signal at a first level and generating a second power-ON detection signal at a second level in response to the reset signal. The select signal generator includes a clamp circuit connected to the power-ON detection circuit for clamping the plurality of select output signals to predetermined levels in response to the first power-ON detection signal and unclamping the plurality of select output signals in response to the second power-ON detection signal.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 35 is a schematic block diagram of a serial access memory.

DETAILED DESCRIPTION OF THE PREFERRED EMBODIMENTS

Figure 1:
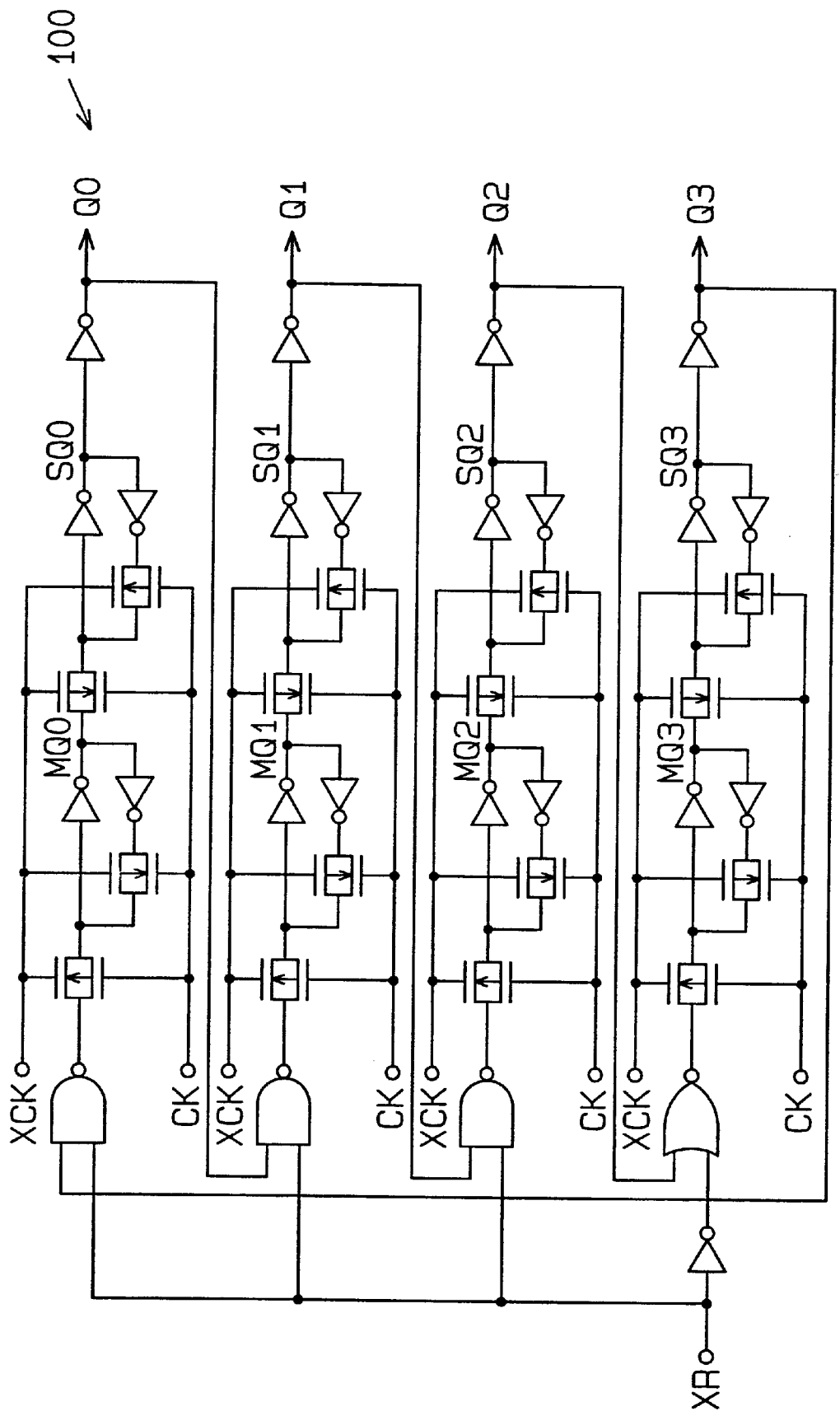
FIG. 1 is a schematic circuit diagram of a first shift register of the prior art.
Figure 2:
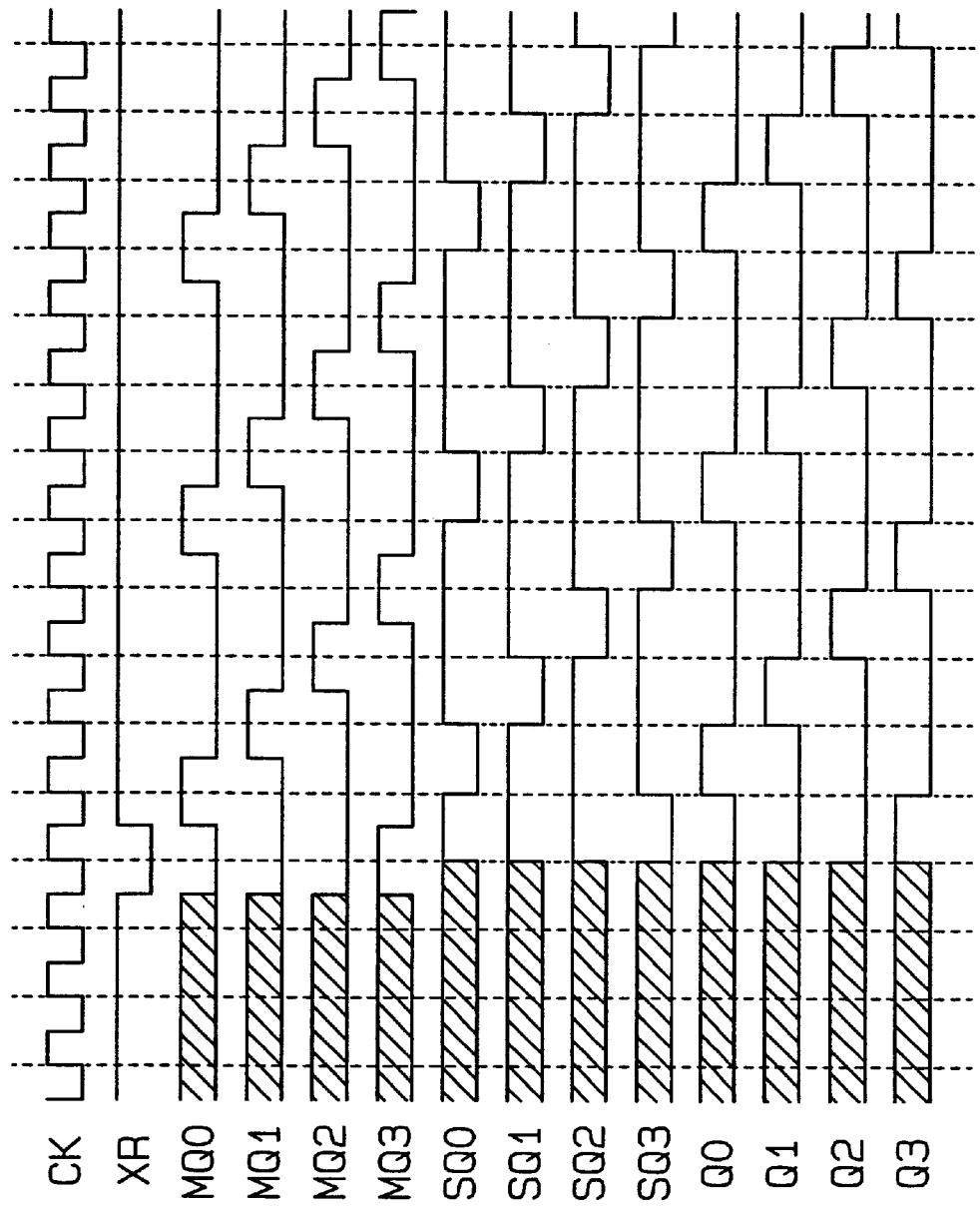
FIG. 2 is a timing chart illustrating the operation of the shift register of FIG. 1.
Figure 3:
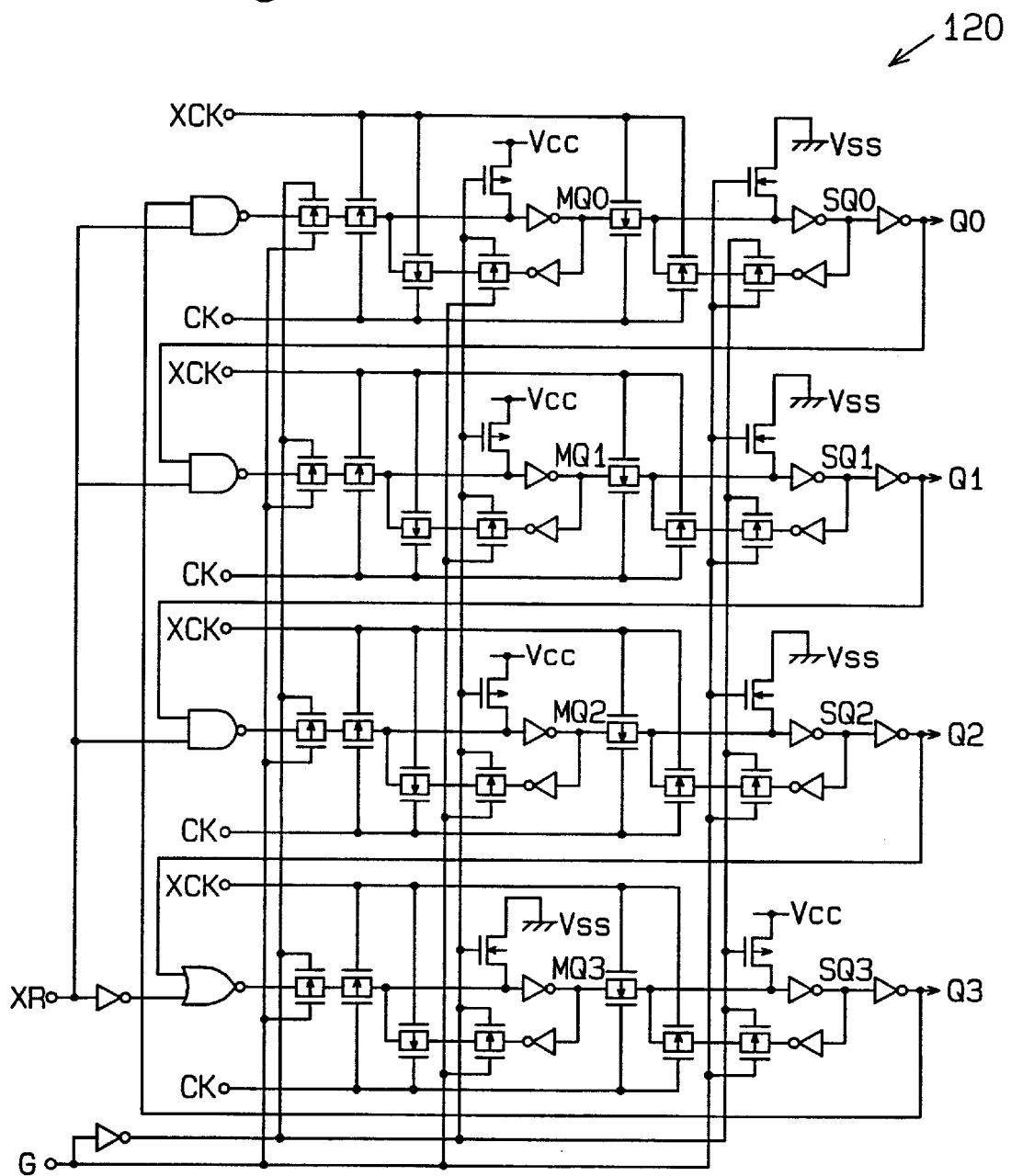
FIG. 3 is a schematic circuit diagram of a second shift register of the prior art.
Figure 4:
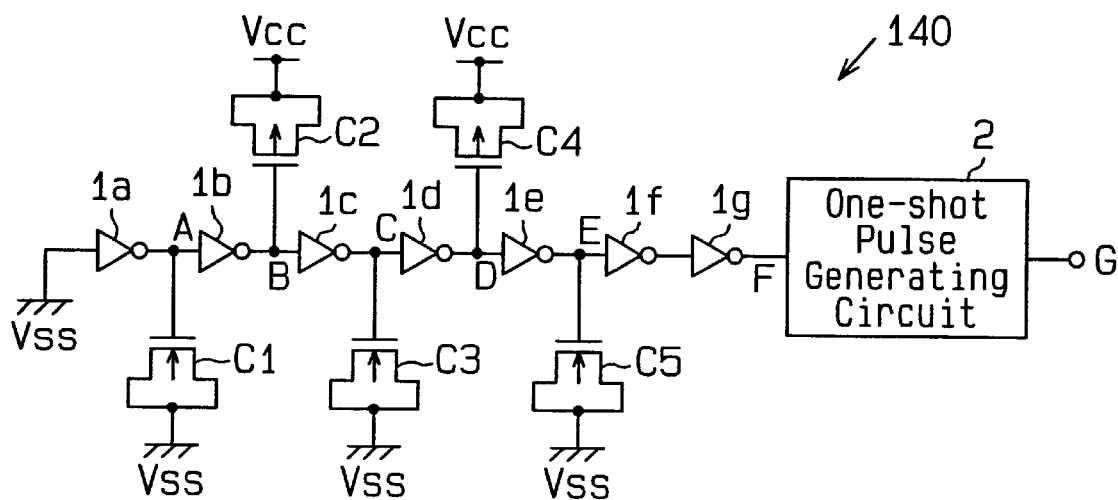
FIG. 4 is a schematic circuit diagram of a power-ON detection circuit connected to the shift register of FIG. 3.
Figure 5:
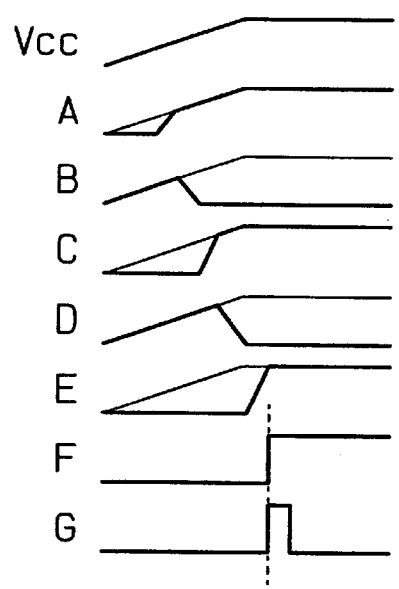
FIG. 5 is a timing chart illustrating the operation of the power-ON detection circuit of FIG. 4.
Figure 6:
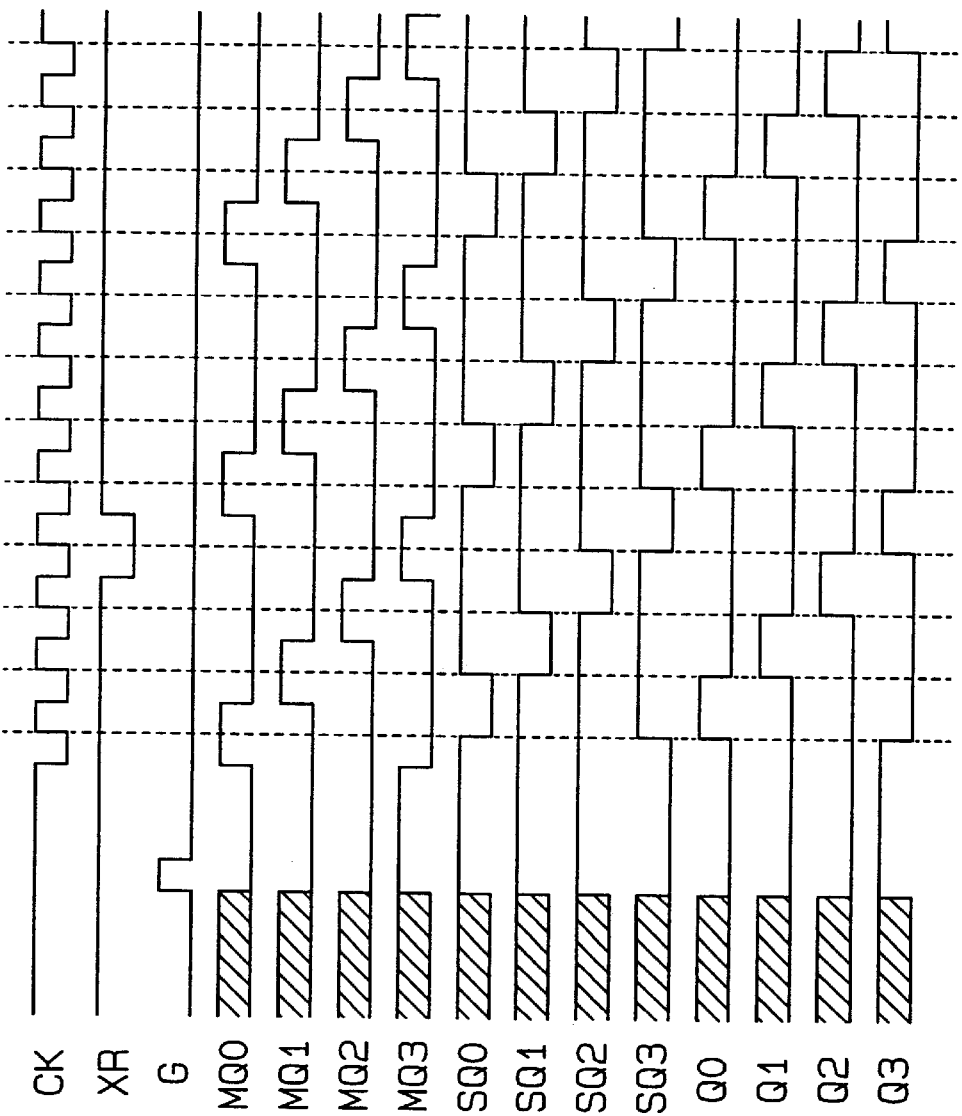
FIG. 6 is a timing chart illustrating the operation of the shift register of FIG. 3.
Figure 7:
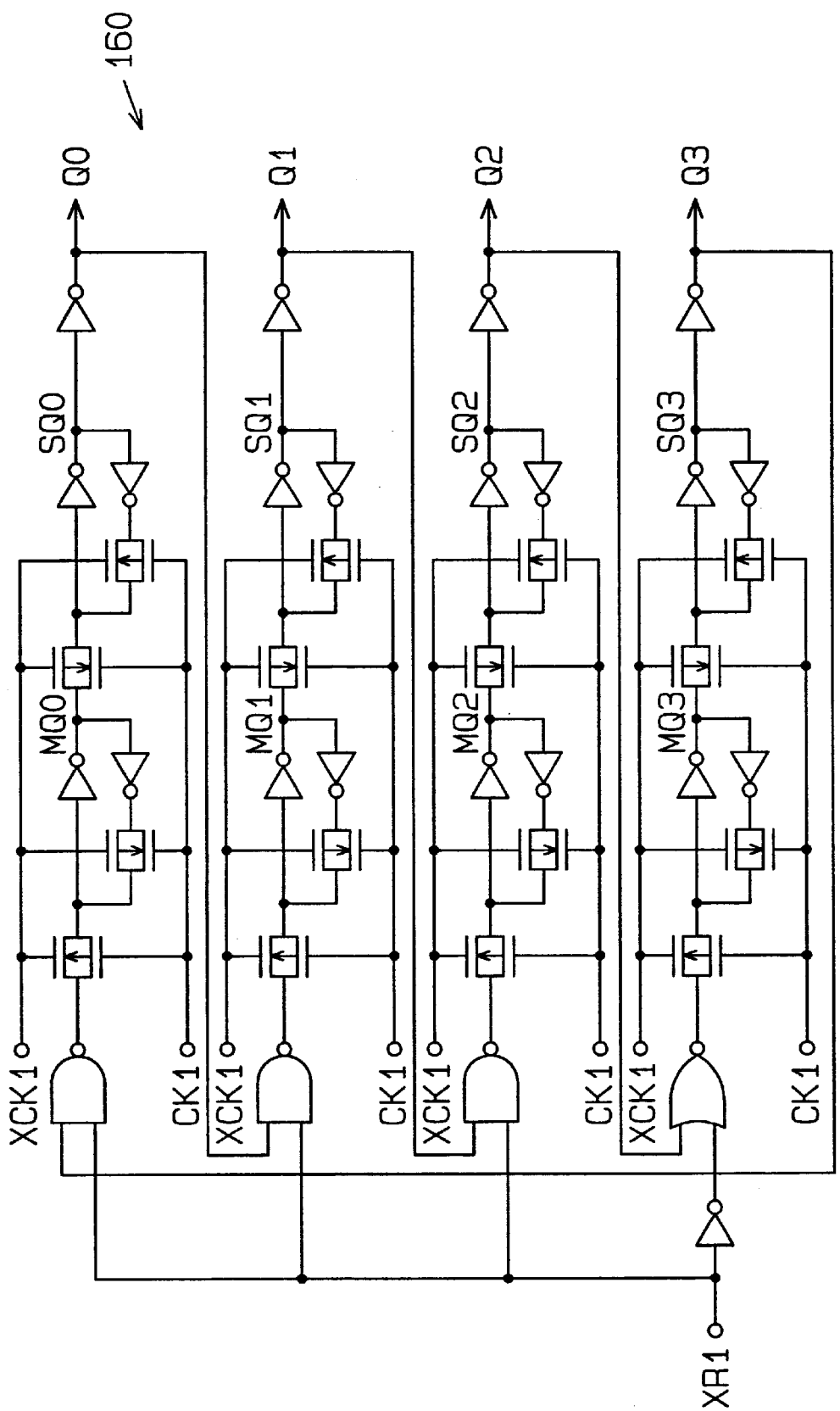
FIG. 7 is a schematic circuit diagram of a third shift register of the prior art.
Figure 8:
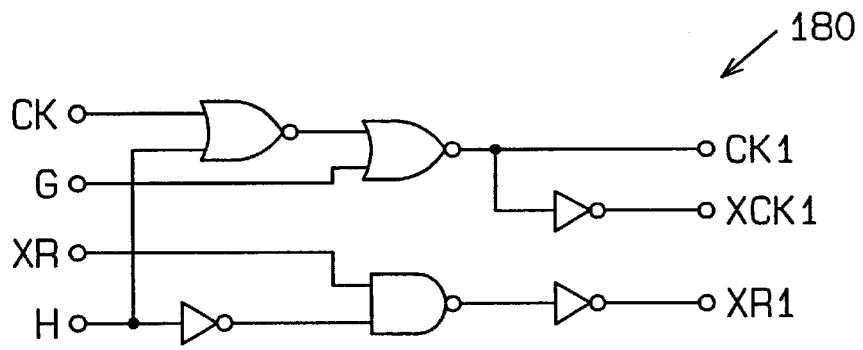
FIG. 8 is a schematic circuit diagram of a reset signal generating circuit connected to the shift register of FIG. 7.
Figure 9:
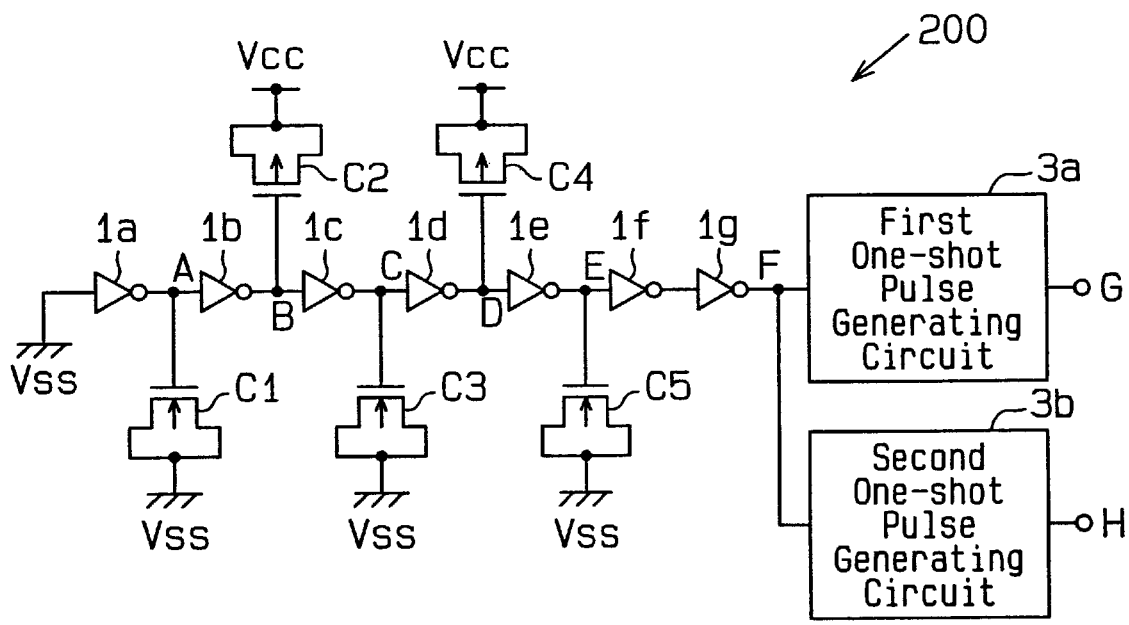
FIG. 9 is a schematic circuit diagram of a power-ON detection circuit connected to the reset signal generating circuit of FIG. 8.
Figure 10:
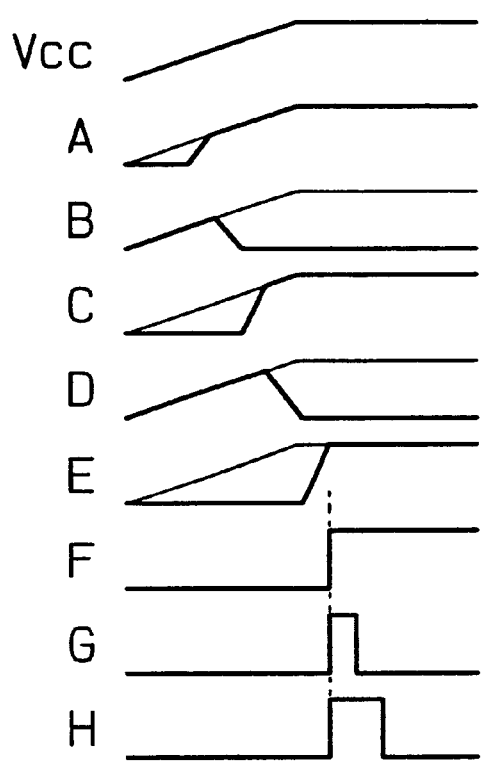
FIG. 10 is a timing chart illustrating the operation of the power-ON detection circuit of FIG. 9.
Figure 11:
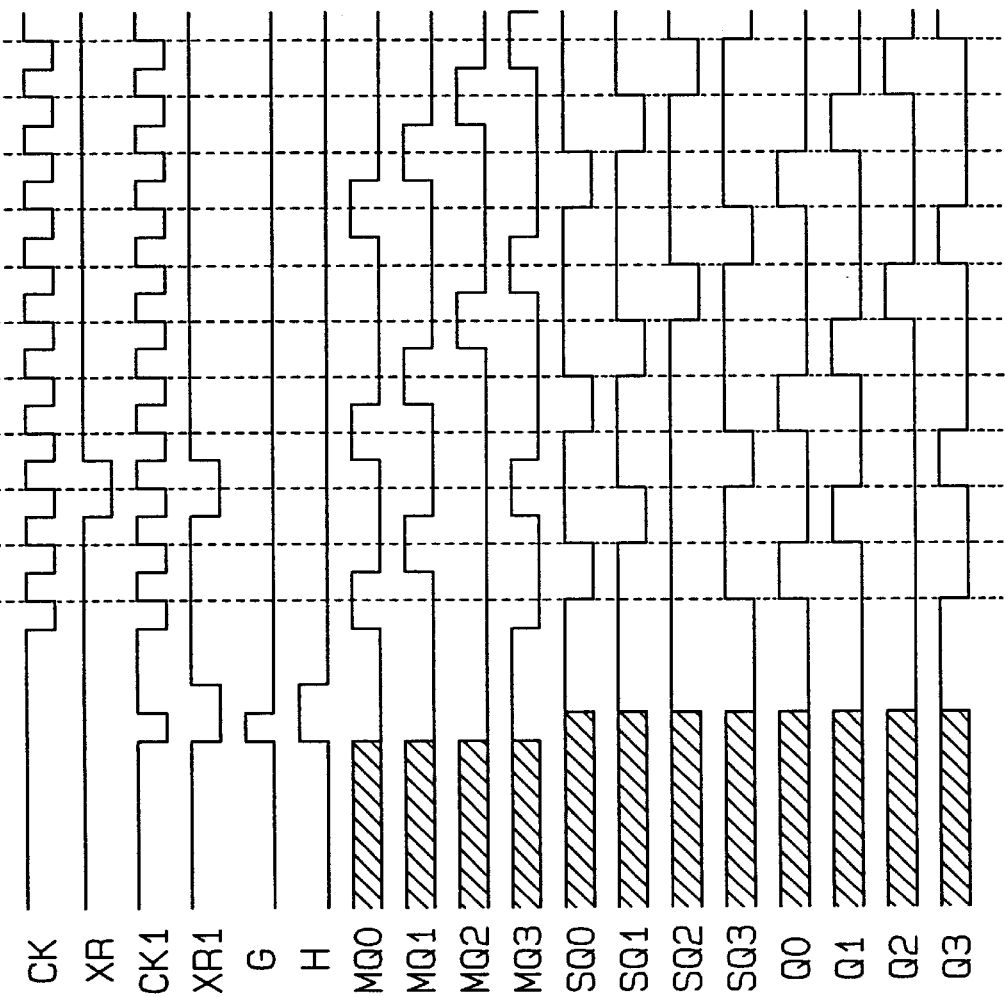
FIG. 11 is a timing chart illustrating the operation of the shift register of FIG. 7.

In the drawings, like numerals are used for like elements throughout.

Figure 20:
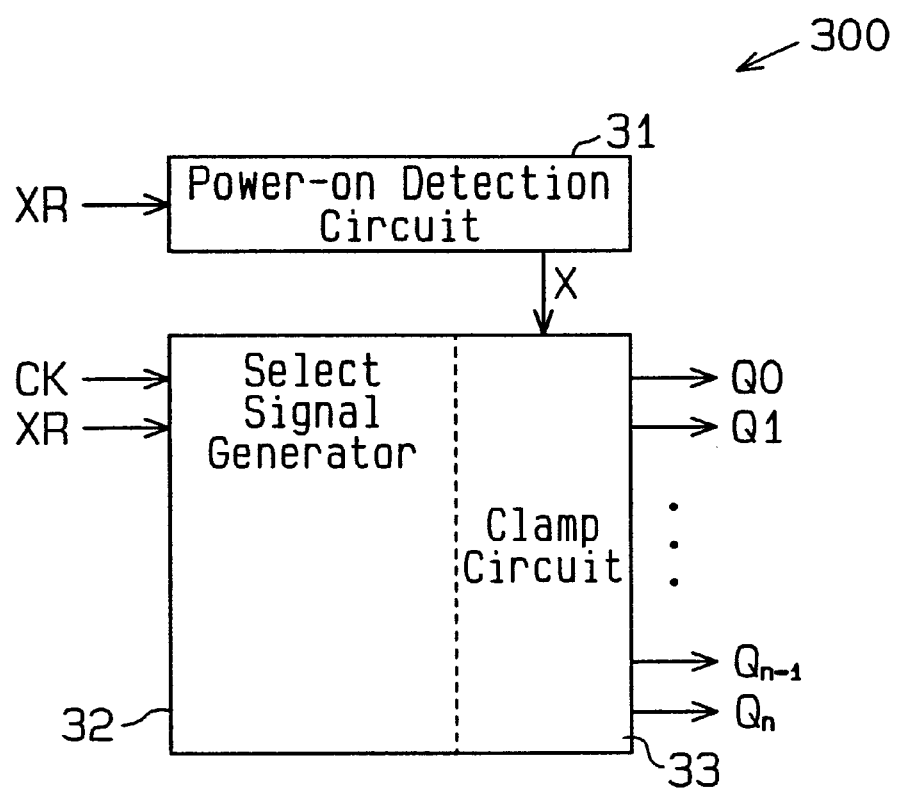
FIG. 20 is a schematic block diagram of a select signal generating circuit according to a first embodiment of the present invention.

As shown in FIG. 20, a select signal generating circuit 300 according to a first embodiment of the present invention includes a power-ON detection circuit 31 and a select signal generator 32 having a clamp circuit 33. The power-ON detection circuit 31 generates a power-ON detection signal X at a predetermined level until it receives a reset signal XR after power on. The clamp circuit 33 clamps select output signals Q0 to Qn from the select signal generator 32 to a predetermined level in response to the power-ON detection signal X. The clamp circuit 33 releases the clamping operation in response to the reset signal XR. The release of the clamping operation causes the select signal generator 32 to output the select output signals Q0–Qn in accordance with a clock signal CK.

Figure 21:
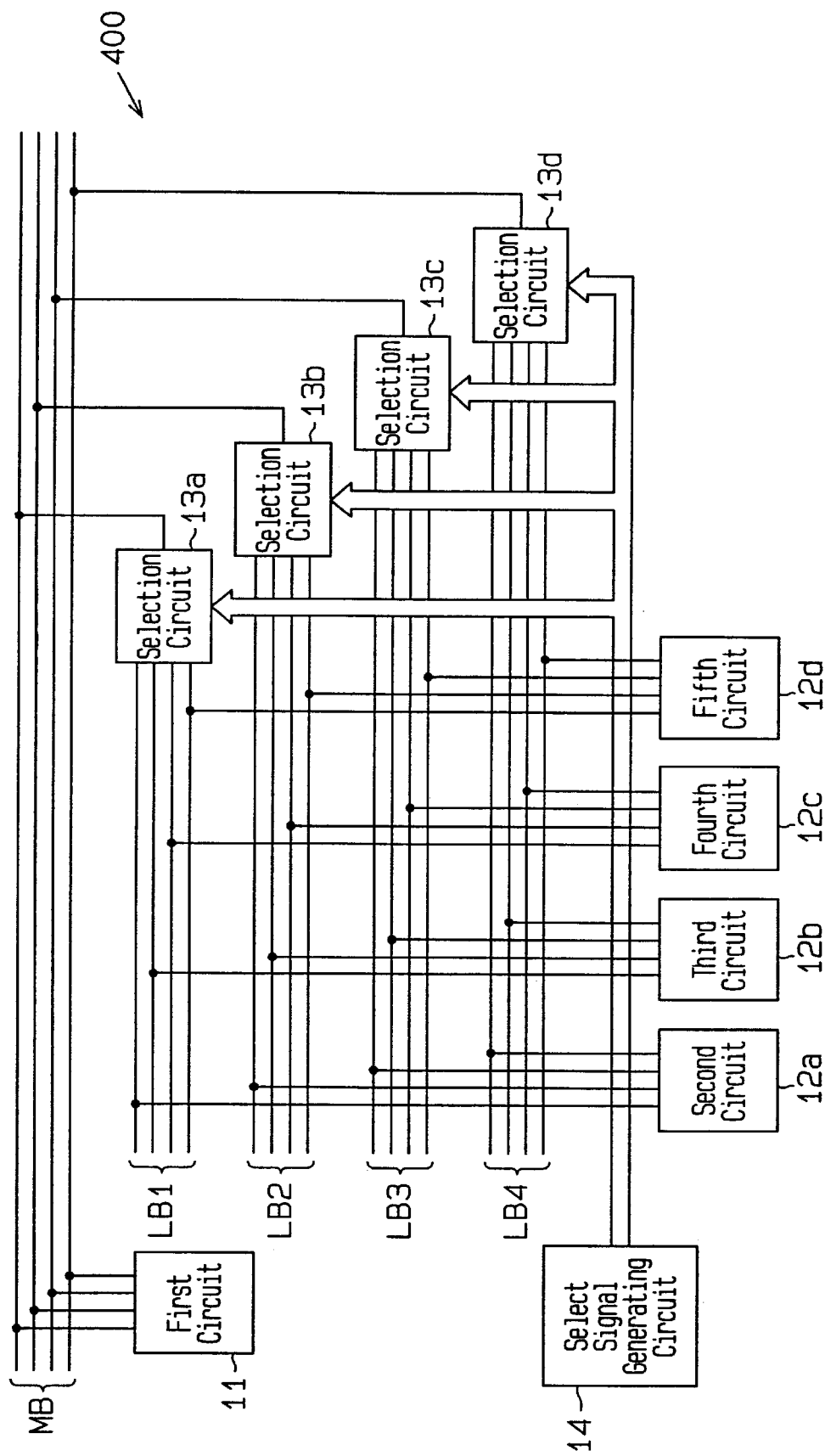
FIG. 21 is a schematic block diagram of a bus selection circuit having a select signal generating circuit according to a second embodiment of the invention.

FIG. 21 is a schematic block diagram of a bus selection circuit 400 having a select signal generating circuit 14 according to a second embodiment of the present invention. The bus selection circuit 400 includes five circuits 11, 12a, 12b, 12c and 12d, selection circuits 13a, 13b, 13c and 13d and the select signal generating circuit 14. The first circuit 11 has 4-bit input and output terminals connected to the respective bit lines of a 4-bit main bus MB. The second circuit 12a has 4-bit input and output terminals connected, one to one, to the respective bit lines of local buses LB1 to LB4. Each of the circuits 12b to 12d likewise has 4-bit input and output terminals connected, one to one, to the respective bit lines of the local buses LB1 to LB4.

The local buses LB1–LB4 are connected to the associated bit lines of the main bus MB via the selection circuits 13a–13d.

Each of the selection circuits 13a–13d connects the associated bit line of the respective local buses LB1–LB4 to the main bus MB in accordance with a select output signal provided from the select signal generating circuit 14.

Figure 22:
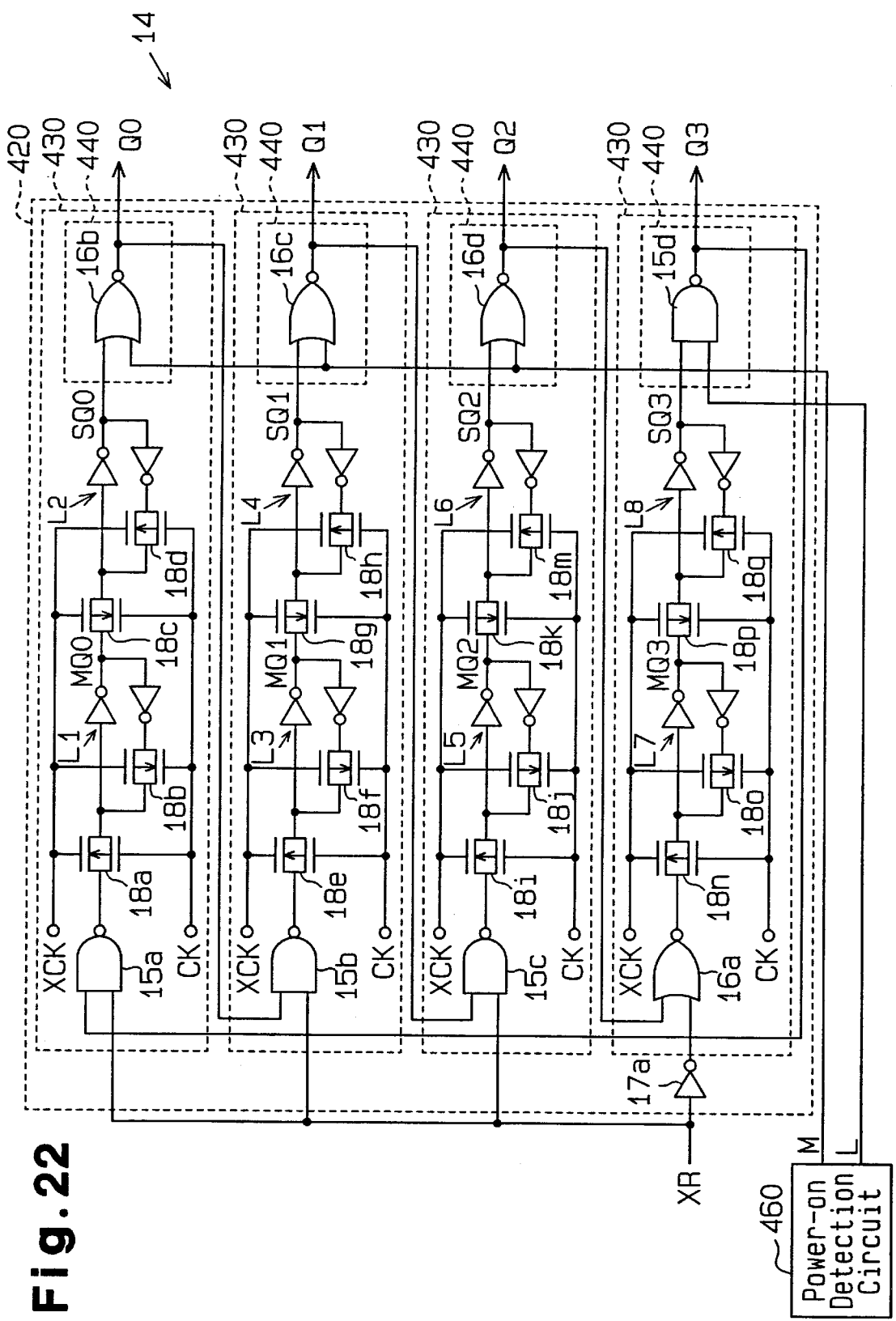
FIG. 22 is a schematic circuit diagram of the select signal generating circuit of FIG. 21.

As shown in FIG. 22, the select signal generating circuit 14 includes a select signal generator 420 and a power-ON detection circuit 460. The select signal generator 420 includes a plurality of flip-flop circuits 430 connected in a ring form with a clamp circuit 440 provided at the output stage of each flip-flop circuit 430. The select signal generator 420 operates as a shift register generating 4-bit select output signals Q0–Q3.

The select signal generator 420 will now be discussed. The reset signal XR is provided to the first input terminals of NAND circuits 15a to 15c and to the first input terminal of a NOR circuit 16a via an inverter circuit 17a. The select output signal Q3 is provided to the second input terminal of the NAND circuit 15a.

The output signal of the NAND circuit 15a is provided to a master stage latch circuit L1 via a transfer gate 18a. The output signal of a feedback inverter circuit of the latch circuit L1 is provided to the input terminal of a forward inverter circuit via a transfer gate 18b.

A latched output signal MQ0 from the latch circuit L1 is provided to a slave stage latch circuit L2 via a transfer gate 18c. The output signal of a feedback inverter circuit of the latch circuit L2 is provided to the input terminal of a forward inverter circuit via a transfer gate 18d. A latched output signal SQ0 from the latch circuit L2 is provided to the NOR circuit 16b serving as the clamp circuit 440, and the select output signal Q0 is output from the NOR circuit 16b.

The clock signal CK is provided to the P channel gates of the transfer gates 18a and 18d and the N channel gates of the transfer gates 18b and 18c. A clock signal XCK, which is a complementary signal of the clock signal CK, is provided to the N channel gates of the transfer gates 18a and 18d and the P channel gates of the transfer gates 18b and 18c.

The select output signal Q0 is provided to the second input terminal of the NAND circuit 15b. The output signal of the NAND circuit 15b is provided to a master stage latch circuit L3 via a transfer gate 18e. The output signal of a feedback inverter circuit of the latch circuit L3 is provided to the input terminal of a forward inverter circuit via a transfer gate 18f. A latched output signal MQ1 from the latch circuit L3 is provided to a slave stage latch circuit L4 via a transfer gate 18g. The output signal of a feedback inverter circuit of the latch circuit L4 is provided to the input terminal of a forward inverter circuit via a transfer gate 18h. A latched output signal SQ1 from the latch circuit L4 is provided to a NOR circuit 16c serving as the clamp circuit 440, and the select output signal Q1 is output from the NOR circuit 16c.

The clock signal CK is provided to the P channel gates of the transfer gates 18e and 18h and the N channel gates of the transfer gates 18f and 18g. The clock signal XCK is provided to the N channel gates of the transfer gates 18e and 18h and the P channel gates of the transfer gates 18f and 18g.

The select output signal Q1 is provided to the second input terminal of the NAND circuit 15c. The output signal of the NAND circuit 15c is provided to a master stage latch circuit L5 via a transfer gate 18i. The output signal of a feedback inverter circuit of the latch circuit L5 is provided to the input terminal of a forward inverter circuit via a transfer gate 18j. A latched output signal MQ2 from the latch circuit L5 is provided to a slave stage latch circuit L6 via a transfer gate 18k. The output signal of a feedback inverter circuit of the latch circuit L6 is provided to the input terminal of a forward inverter circuit via a transfer gate 18m. A latched output signal SQ2 from the latch circuit L6 is provided to a NOR circuit 16d at the clamp circuit 440, and the select output signal Q2 is output from the NOR circuit 16d.

The clock signal CK is provided to the P channel gates of the transfer gates 18i and 18m and the N channel gates of the transfer gates 18j and 18k. The clock signal XCK is provided to the N channel gates of the transfer gates 18i and 18m and the P channel gates of the transfer gates 18j and 18k.

The select output signal Q2 is provided to the second input terminal of the NOR circuit 16a. The output signal of the NOR circuit 16a is provided to a master stage latch circuit L7 via a transfer gate 18n. The output signal of a feedback inverter circuit of the latch circuit L7 is provided to the input terminal of a forward inverter circuit via a transfer gate 18o. A latched output signal MQ3 from the latch circuit L7 is provided to a slave stage latch circuit L8 via a transfer gate 18p. The output signal of a feedback inverter circuit of the latch circuit L8 is provided to the input terminal of a forward inverter circuit via a transfer gate 18q. A latched output signal SQ3 from the latch circuit L8 is provided to a NAND circuit 15d serving as the clamp circuit 440, and the select output signal Q3 is output from the NAND circuit 15d.

The clock signal CK is provided to the P channel gates of the transfer gates 18n and 18q and the N channel gates of the transfer gates 18o and 18p. The clock signal XCK is provided to the N channel gates of the transfer gates 18n and 18q and the P channel gates of the transfer gates 18o and 18p.

The power-ON detection circuit 460 generates power-ON detection signals M and L, and provides the power-ON detection signal M to the NOR circuits 16b–16d and the power-ON detection signal L to the NAND circuit 15d.

Figure 23:
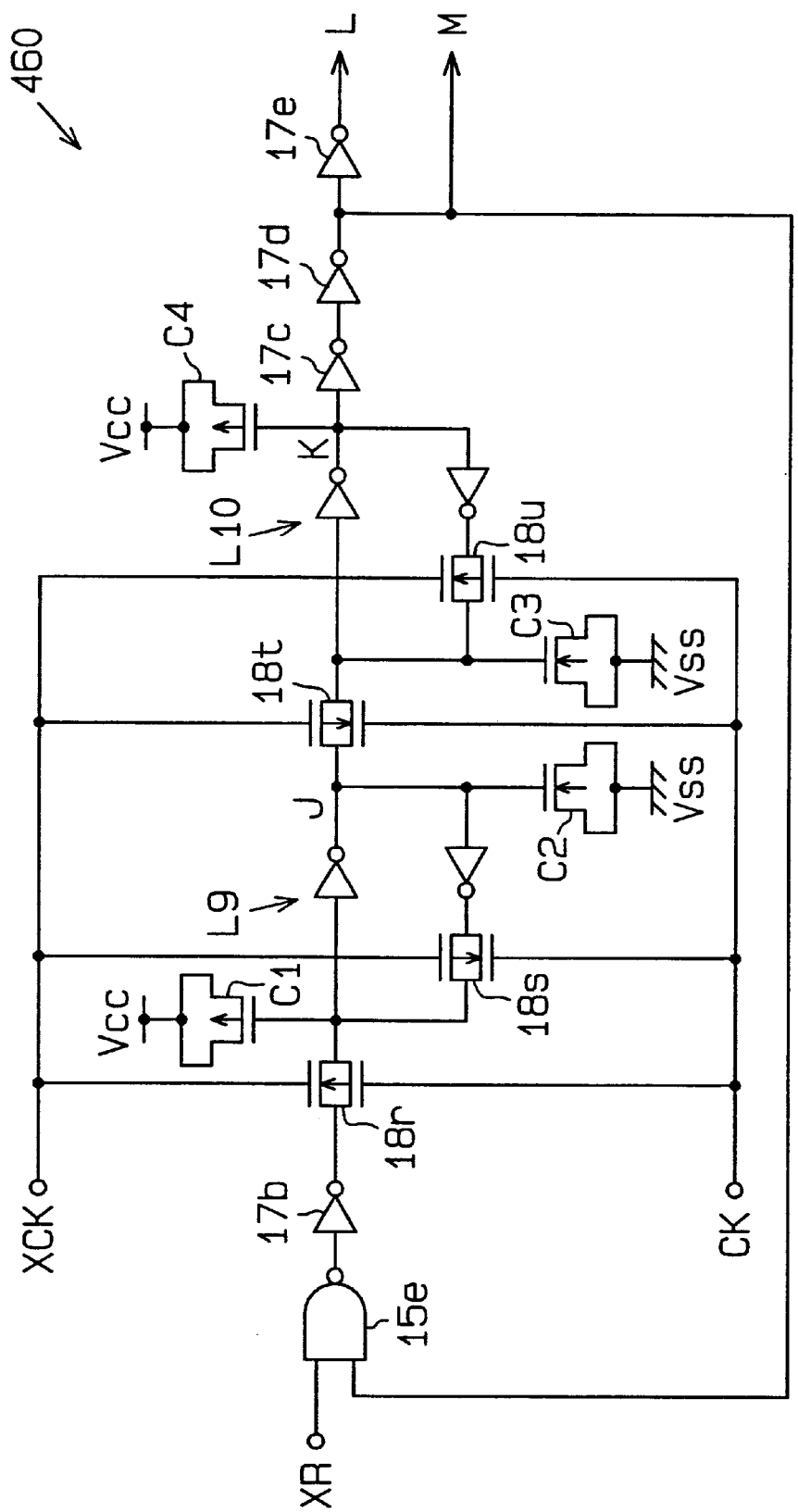
FIG. 23 is a schematic circuit diagram of a power-ON detection circuit of the select signal generating circuit of FIG. 22.

The power-ON detection circuit 460 is described in FIG. 23.

As shown in FIG. 23, the reset signal XR is provided to the first input terminal of a NAND circuit 15e whose output signal is provided to a master stage latch circuit L9 via an inverter circuit 17b and a transfer gate 18r. The input terminal of the latch circuit L9 is connected to a high-potential power supply Vcc via a capacitor C1, and the output terminal (node J) of the latch circuit L9 is connected to a low-potential power supply Vss via a capacitor C2. The output signal of a feedback inverter circuit of the latch circuit L9 is provided to the input terminal of a forward inverter circuit via a transfer gate 18s.

The node J is connected to the input terminal of a slave stage latch circuit L10 via a transfer gate 18t, and the input terminal of the slave stage latch circuit L10 is connected to the power supply Vss via a capacitor C3. The output terminal (node K) of the latch circuit L10 is connected to the power supply Vcc via a capacitor C4. The output signal of a feedback inverter circuit of the latch circuit L10 is provided to the input terminal of a forward inverter circuit via a transfer gate 18u. The latched output signal of the latch circuit L10 is output as the power-ON detection signal M via two inverter circuits 17c and 17d, and is output as the power-ON detection signal L via three inverter circuits 17c, 17d and 17e. The power-ON detection signal M is provided to the second input terminal of the NAND circuit 15e.

Figure 24:
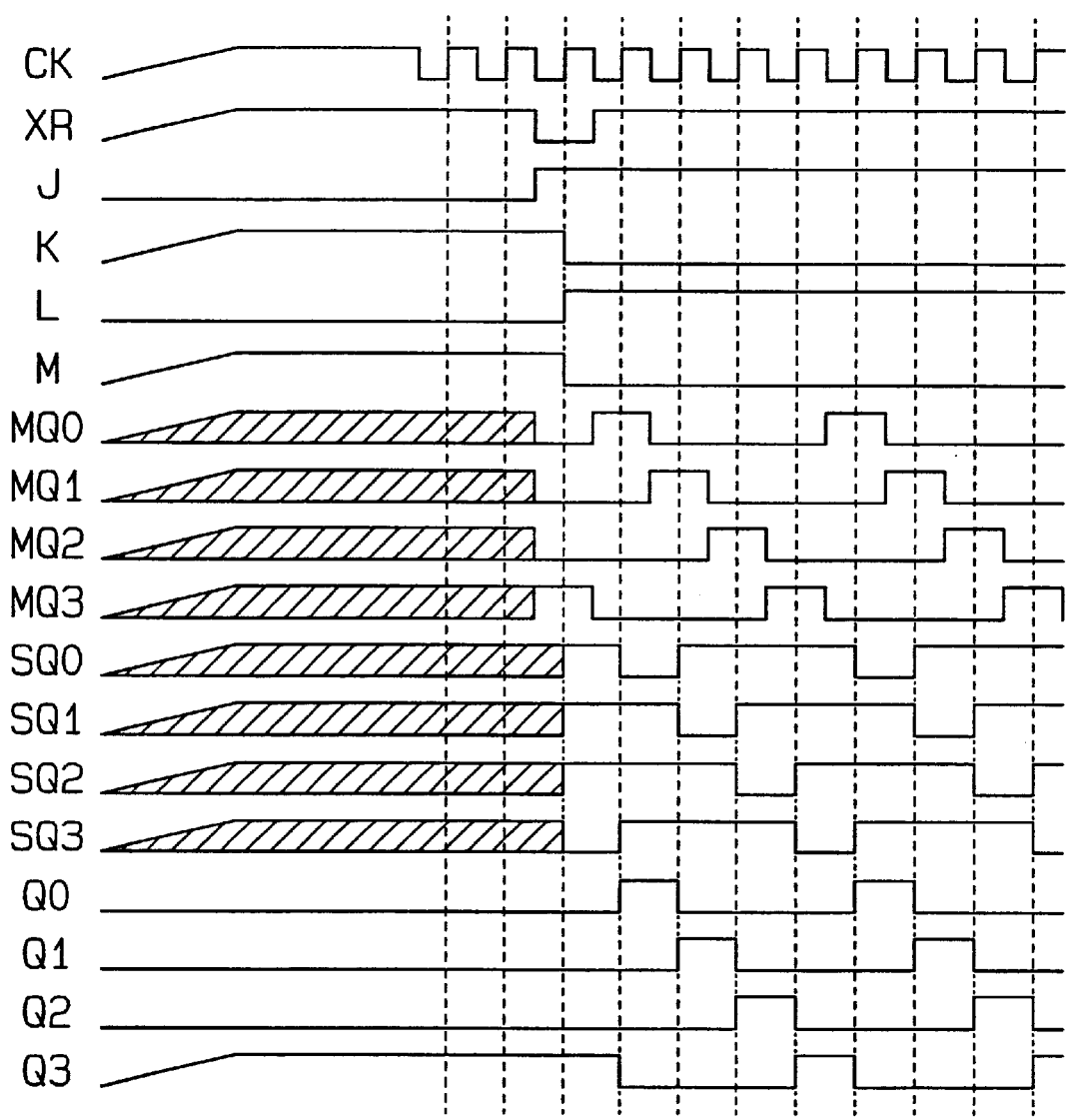
FIG. 24 is a timing chart illustrating the operation of the select signal generating circuit of FIG. 22.

The operation of the select signal generating circuit 14 is described in FIG. 24.

When power is provided from the power supplies Vcc and Vss, the capacitors C1 and C2 set the voltage at the node J to a low level and the capacitors C3 and C4 set the voltage at the node K to a high level in the power-ON detection circuit 460. Then, the voltage of the power-ON detection signal L is fixed to a low level, and the voltage of the power-ON detection signal M rises together with the supply voltage Vcc and is set to a high level.

In the select signal generator 420, when the high-level power-ON detection signal M is provided to the NOR circuits 16b–16d, the select output signals Q0–Q2 are clamped to low levels. That is, the select output signals Q0–Q2 are clamped as non-select signals. When the low-level power-ON detection signal L is provided to the NAND circuit 15d, the voltage of the select output signal Q3 rises together with the supply voltage Vcc and is clamped to a high level. That is, the select output signal Q3 is clamped as a select signal. At this time, when the clock signal CK and the reset signal XR are maintained at high levels as the level of the supply voltage Vcc rises, the transfer gates 18r and 18u of the power-ON detection circuit 460 are disabled. As a result, the voltages at the nodes J and K are maintained high. In the select signal generator 420, the transfer gates 18a, 18d, 18e, 18h, 18i, 18m, 18n and 18q are disabled, so that the latched output signals MQ0–MQ3 and SQ0–SQ3 of the latch circuits L1–L8 are all unsettled.

When the clock signal CK having a predetermined frequency and the low-level reset signal XR are provided after the supply voltage Vcc is stabilized, the voltage at the node J rises to a high level in accordance with the falling of the clock signal CK, and the voltage at the node K falls to a low level in accordance with the subsequent rising of the clock signal CK in the power-ON detection circuit 460. Then, the power-ON detection signal L rises to a high level, and the power-ON detection signal M falls to a low level. In this manner, the power-ON detection signals L and M unclamp the select output signals Q0–Q3.

In the select signal generator 420, the clock signal CK and the low-level reset signal XR reset the latched output signals MQ0–MQ2 of the latch circuits L1, L3 and L5 to low levels, and reset the latched output signal MQ3 of the latch circuit L7 to a high level.

Next, the rising of the clock signal CK and the latched output signals MQ0–MQ3 cause the latched output signals SQ0–SQ2 of the latch circuits L2, L4 and L6 to rise to high levels, and causes the latched output signal SQ3 of the latch circuit L8 to fall to a low level.

After the reset signal XR returns to a high level, the latched output signals MQ0–MQ3 of the master stages rise to high levels sequentially in response to the falling of the clock signal CK, and the latched output signals SQ0–SQ3 of the slave stages fall in sequence in response to the rising of the clock signal CK. The select output signals Q0–Q3 rise to high levels in the same order as the latched output signals SQ0–SQ3 rise to high levels.

Figure 25:
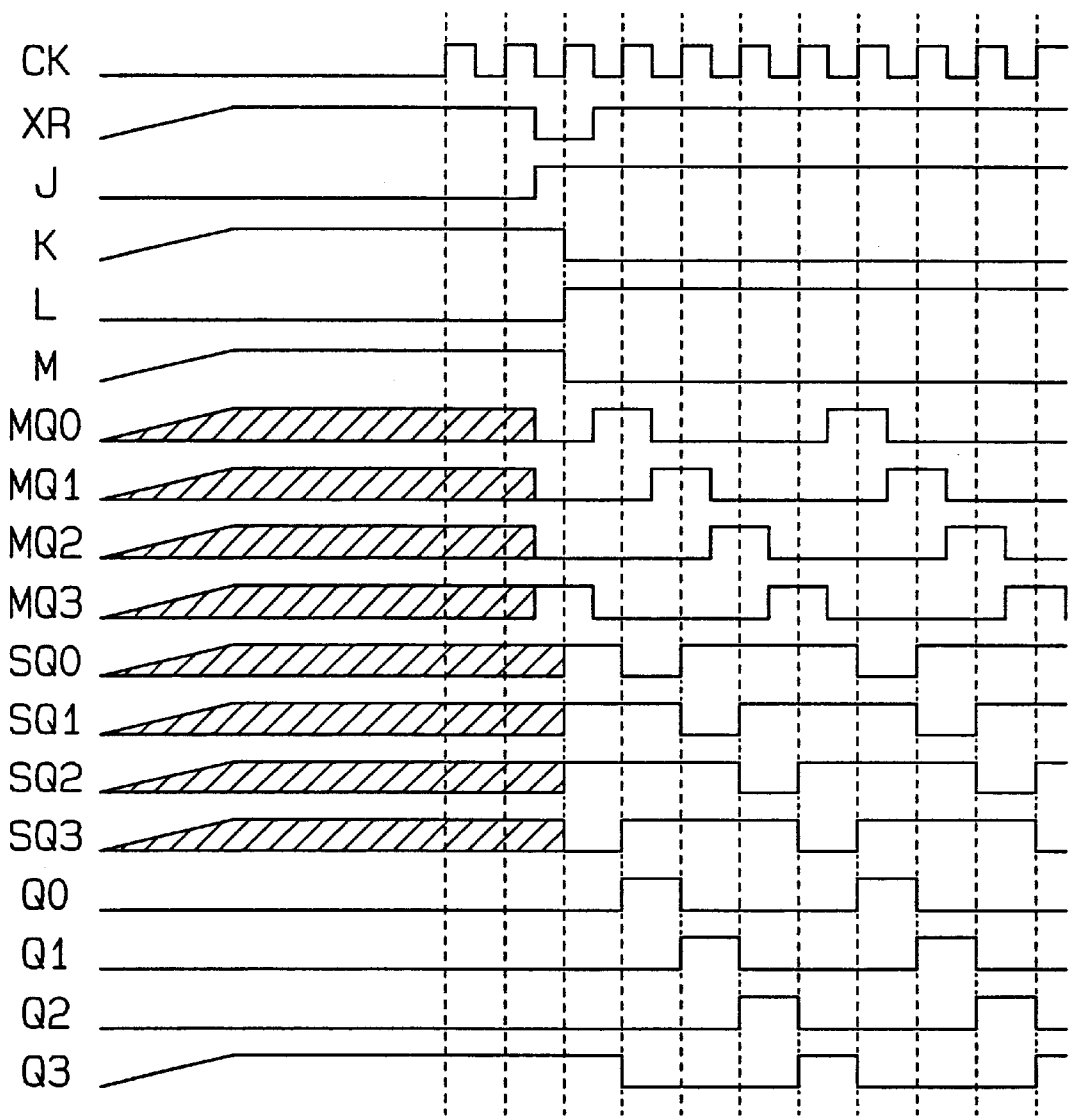
FIG. 25 is a timing chart illustrating the operation of the select signal generating circuit of FIG. 22.

FIG. 25 shows a case where the clock signal CK having a predetermined frequency is provided after the clock signal CK is maintained at a low level for a predetermined time since power on.

In this case, the select output signals Q0–Q3 are clamped by the power-ON detection signals L and M such that only the select output signal Q3 is maintained at a high level, while the select output signals Q0–Q2 are maintained at low levels. Next, when the low-level reset signal XR is provided after providing the clock signal CK, the select signal generating circuit 14 operates in the same way as shown in FIG. 24.

Figure 26:
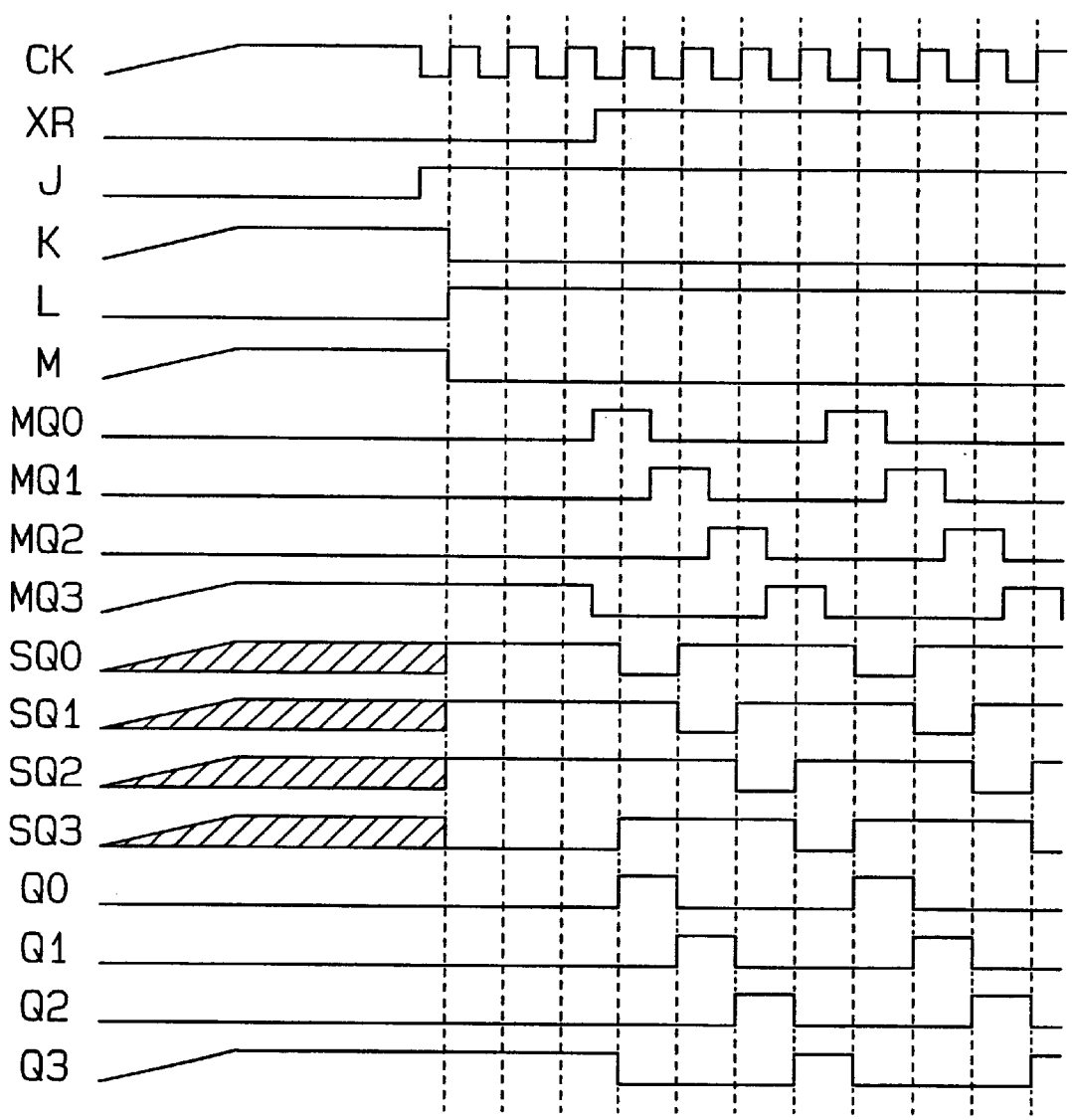
FIG. 26 is a timing chart illustrating the operation of the select signal generating circuit of FIG. 22.

FIG. 26 shows a case where the clock signal CK is maintained at a high level, and the reset signal XR is maintained at a low level upon power on, and the clock signal CK having a predetermined frequency is provided when a predetermined time passes since power on.

In this case, the latched output signals MQ0–MQ3 of the master stages are reset in accordance with the first falling of the clock signal CK, and the slave output signals SQ0–SQ3 of the slave stages are reset in accordance with the first rising of the clock signal CK. The power-ON detection signals L and M are reset in accordance with the first rising of the clock signal CK, thus unclamping the select output signals Q0–Q3. When the reset signal XR rises to a high level, the select signal generating circuit 14 operates in the same way as shown in FIG. 24.

Figure 27:
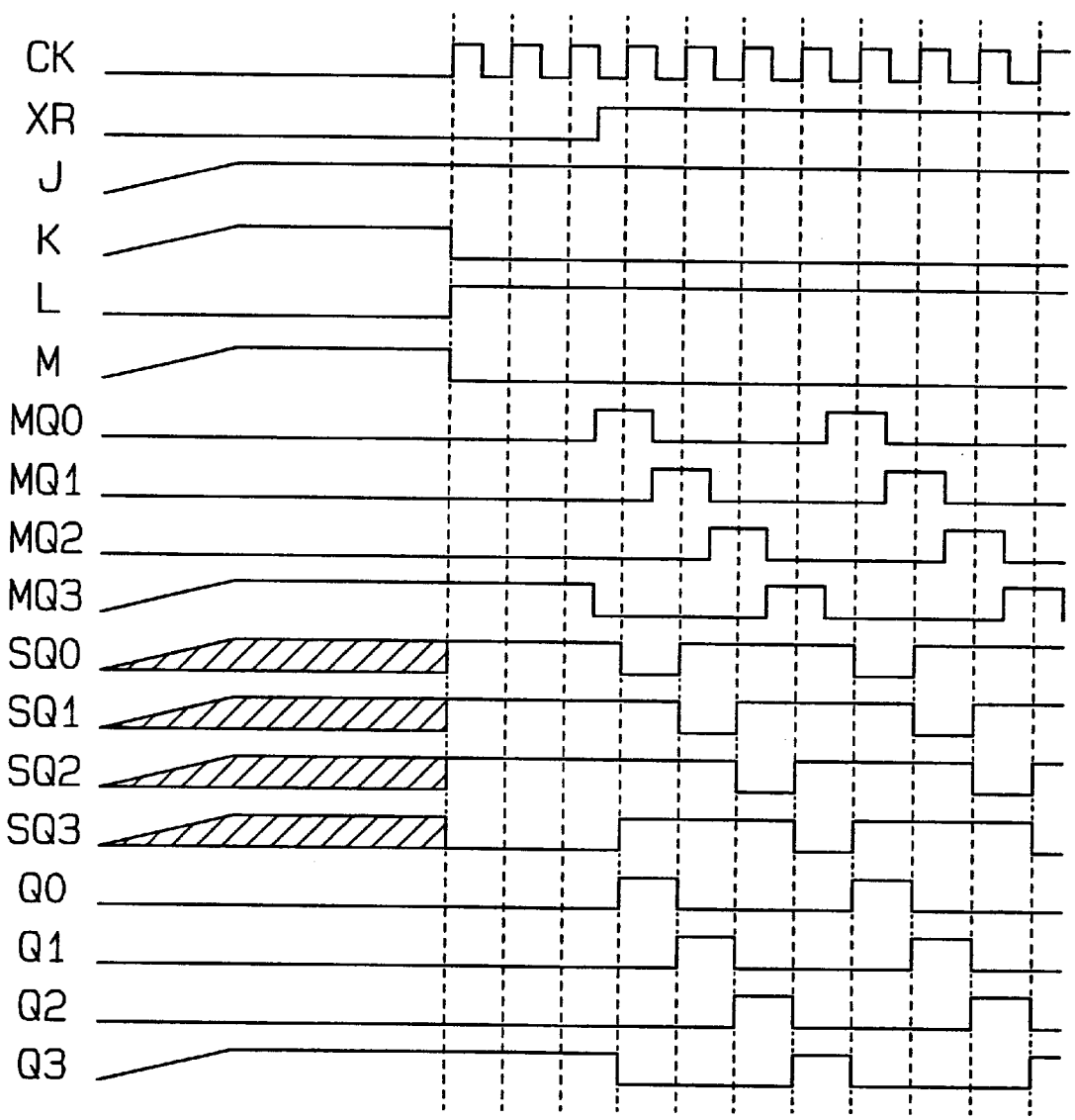
FIG. 27 is a timing chart illustrating the operation of the select signal generating circuit of FIG. 22.

FIG. 27 shows a case where the clock signal CK is maintained at a low level, the reset signal XR is maintained at a low level upon power on, and the clock signal CK having a predetermined frequency is provided when a predetermined time passes since power on.

In this case, the latched output signals MQ0–MQ3 of the master stages are reset by the power-on, and the slave output signals SQ0–SQ3 of the slave stages are reset in accordance with the first rising of the clock signal CK. The power-ON detection signals L and M are reset in accordance with the first rising of the clock signal CK, thus unclamping the select output signals Q0–Q3. When the reset signal XR rises to a high level, the select signal generating circuit 14 operates in the same way as shown in FIG. 24.

The select signal generating circuit 14 according to the first embodiment has the following advantages.

(1) When power is provided from the power supplies Vcc and Vss, the select output signal Q3 is clamped to a high level, and the select output signals Q0–Q2 are clamped to low levels. After the reset signal XR is provided, the select output signals Q0–Q3 are sequentially set to high levels in accordance with the clock signal CK. This prevents multiple selection of the main bus MB and the local buses LB by the selection circuits 13a–13d, thus preventing the occurrence of a bus conflict.

(2) The power-ON detection circuit 460 has the capacitors C1–C4 connected to the input and output terminals of the master stage and slave stage, whereas unlike the prior art, the select signal generator 420 does not have additional transfer gates and capacitors. This prevents the circuit area of the select signal generating circuit 14 from increasing.

(3) Since it is unnecessary to add transfer gates and capacitors to the select signal generator 420, the operational speed of the select signal generating circuit 14 is prevented from decreasing.

(4) The power-ON detection signals L and M are provided to the NOR circuits 16b–16d and the NAND circuit 15d of the select signal generator 420 in accordance with the power-on. This eliminates the need for any restriction on the power-on and ensure the clamping of the select output signals Q0–Q3.

Since the node J is surely set to a low level and the node K is surely set to a high level in the power-ON detection circuit 460 in accordance with the providing of power from the supply voltages Vcc and Vss, the PMOS transistor of the forward inverter circuit of the latch circuit L9 and the PMOS transistor of the feedback inverter circuit of the latch circuit L10 may be designed to have smaller driving capability than the associated NMOS transistors.

Further, the PMOS transistor of the feedback inverter circuit of the latch circuit L9 and the PMOS transistor of the forward inverter circuit of the latch circuit L10 may be designed to have greater driving capability than the associated NMOS transistors.

Figure 28:
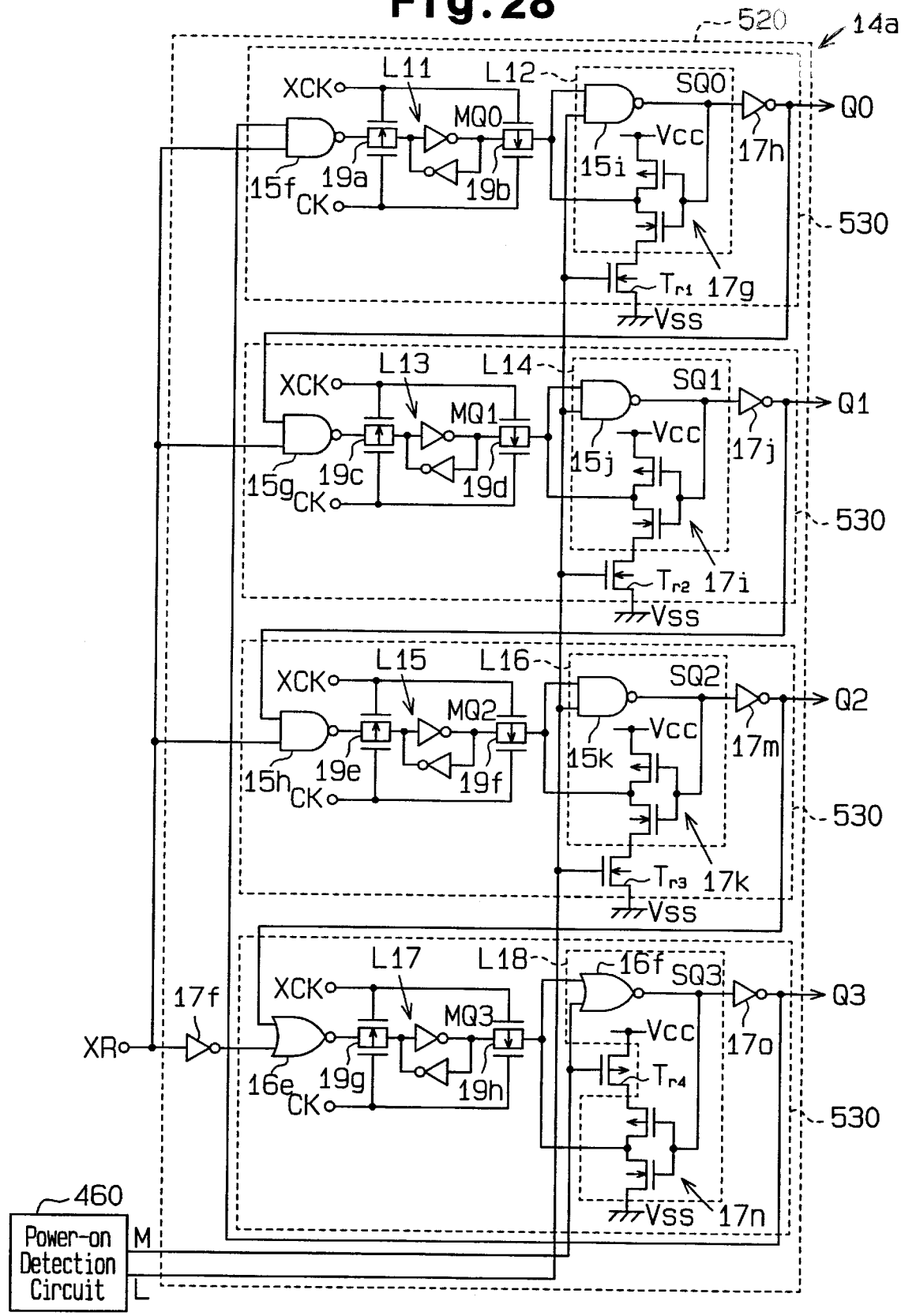
FIG. 28 is a schematic circuit diagram of a select signal generating circuit according to a third embodiment of the invention.

FIG. 28 shows a select signal generating circuit 14a operating as a shift register according to a third embodiment of the present invention. The select signal generating circuit 14a includes the power-ON detection circuit 460 and a select signal generator 520. The select signal generator 520 includes a plurality of flip-flop circuits 530 connected in a ring form. Three flip-flop circuits 530 include three clamp circuits which are NAND circuits 15i to 15k, and one flip-flop circuit 530 includes a clamp circuit which is a NOR circuit 16f.

The reset signal XR is provided to the first input terminals of NAND circuits 15f to 15h and to the first input terminal of a NOR circuit 16e via an inverter circuit 17f.

The output signal of the NAND circuit 15f is provided to a master stage latch circuit L11 via a transfer gate 19a. A latched output signal MQ0 from the latch circuit L11 is provided to the first input terminal of a NAND circuit 15i via a transfer gate 19b. The output signal of the NAND circuit 15i is provided to the first input terminal of the NAND circuit 15i via an inverter circuit 17g. The NAND circuit 15i and the inverter circuit 17g form a slave stage latch circuit L12. The output signal SQ0 of the latch circuit L12 is output as the select output signal Q0 via an inverter circuit 17h. The select output signal Q0 is also provided to the second input terminal of the NAND circuit 15g.

The source of an NMOS transistor of the inverter circuit 17g is connected to the power supply Vss via an NMOS transistor Tr1. The power-ON detection signal L is provided to the gate of the transistor Tr1 and the second input terminal of the NAND circuit 15i.

The clock signal CK is provided to the P channel gate of the transfer gate 19a and the N channel gate of the transfer gates 19b, and the clock signal XCK is provided to the N channel gate of the transfer gate 19a and the P channel gate of the transfer gate 19b.

The output signal of the NAND circuit 15g is provided to a master stage latch circuit L13 via a transfer gate 19c. A latched output signal MQ1 from the latch circuit L13 is provided to the first input terminal of a NAND circuit 15j via a transfer gate 19*d*. The output signal of the NAND circuit 15*j* is provided to the first input terminal of the NAND circuit 15*j* via an inverter circuit 17*i*. The NAND circuit 15*j* and the inverter circuit 17*i* form a slave stage latch circuit L14. The output signal SQ1 of the latch circuit L14 is output as the select output signal Q1 via an inverter circuit 17*j*. The select output signal Q1 is also provided to the second input terminal of the NAND circuit 15*h*.

The source of an NMOS transistor of the inverter circuit 17*i* is connected to the power supply Vss via an NMOS transistor Tr2. The power-ON detection signal L is provided to the gate of the transistor Tr2 and the second input terminal of the NAND circuit 15*j*.

The clock signal CK is provided to the P channel gate of the transfer gate 19*c* and the N channel gate of the transfer gates 19*d*, and the clock signal XCK is provided to the N channel gate of the transfer gate 19*c* and the P channel gate of the transfer gate 19*d*.

The output signal of the NAND circuit 15*h* is provided to a master stage latch circuit L15 via a transfer gate 19*e*. A latched output signal MQ2 from the latch circuit L15 is provided to the first input terminal of a NAND circuit 15*k* via a transfer gate 19*f*. The output signal of the NAND circuit 15*k* is provided to the first input terminal of the NAND circuit 15*k* via an inverter circuit 17*k*. The NAND circuit 15*k* and the inverter circuit 17*k* form a slave stage latch circuit L16. The output signal SQ2 of the latch circuit L16 is output as the select output signal Q2 via an inverter circuit 17*m*. The select output signal Q2 is also provided to the first input terminal of the NOR circuit 16*e*.

The source of an NMOS transistor of the inverter circuit 17*k* is connected to the power supply Vss via an NMOS transistor Tr3. The power-ON detection signal L is provided to the gate of the transistor Tr3 and the second input terminal of the NAND circuit 15*k*.

The clock signal CK is provided to the P channel gate of the transfer gate 19*e* and the N channel gate of the transfer gates 19*f*, and the clock signal XCK is provided to the N channel gate of the transfer gate 19*e* and the P channel gate of the transfer gate 19*f*.

The output signal of the NOR circuit 16*e* is provided to a master stage latch circuit L17 via a transfer gate 19*g*. A latched output signal MQ3 from the latch circuit L17 is provided to the first input terminal of a NOR circuit 16*f* via a transfer gate 19*h*. The output signal of the NOR circuit 16*f* is provided to the first input terminal of the NOR circuit 16*f* via an inverter circuit 17*n*. The NOR circuit 16*f* and the inverter circuit 17*n* form a slave stage latch circuit L18. The output signal SQ3 of the latch circuit L18 is output as the select output signal Q3 via an inverter circuit 17*o*. The select output signal Q3 is also provided to the second input terminal of the NAND circuit 15*f*.

The source of a PMOS transistor of the inverter circuit 17*n* is connected to the power supply Vcc via a PMOS transistor Tr4. The power-ON detection signal M is provided to the gate of the transistor Tr4 and the second input terminal of the NOR circuit 16*f*.

The clock signal CK is provided to the P channel gate of the transfer gate 19*g* and the N channel gate of the transfer gate 19*h*, and the clock signal XCK is provided to the N channel gate of the transfer gate 19*g* and the P channel gate of the transfer gate 19*h*.

It is preferable that the feedback inverter circuit in each of the latch circuits L11, L13, L15 and L17 should have a smaller load driving capability than the forward inverter circuit. It is further preferable that the inverter circuits 17*g*, 17*i*, 17*k* and 17*n* should have smaller load driving capabilities than the NAND circuits 15*i*, 15*j* and 15*k* and the NOR circuit 16*f*.

Figure 29:
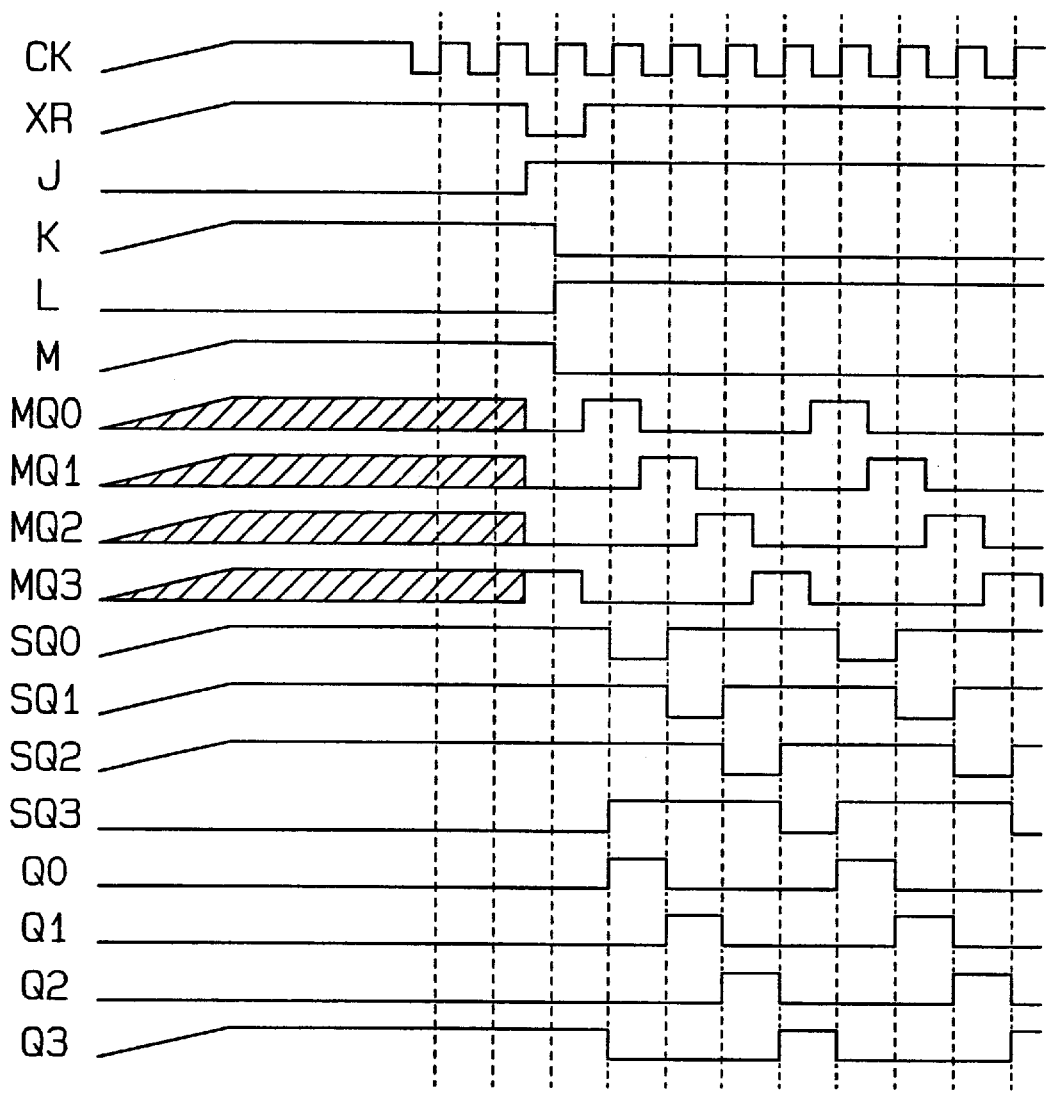
FIG. 29 is a timing chart illustrating the operation of the select signal generating circuit of FIG. 28.

The operation of the select signal generating circuit 14*a* is discussed in FIG. 29.

When power is provided from the supply voltages Vcc and Vss, the power-ON detection signal L of the power-ON detection circuit 460 is fixed to a low level and the power-ON detection signal M rises together with the supply voltage Vcc to a high level.

When the high-level power-ON detection signal M is provided to the NOR circuit 16*f*, the latched output signal SQ3 of the latch circuit L18 falls to a low level, and the select output signal Q3 rises together with the supply voltage Vcc to a high level. That is, the select output signal Q3 is clamped as a select signal.

When the low-level power-ON detection signal L is provided to the NAND circuits 15*i*, 15*j* and 15*k*, the latched output signals SQ0, SQ1 and SQ2 of the latch circuits L12, L14 and L16 rise to high levels together with the supply voltage Vcc, and the select output signals Q0–Q2 are clamped to low levels. That is, the select output signals Q0–Q2 are clamped as non-select signals.

In the select signal generator 520, the transfer gates 19*a*, 19*c*, 19*e* and 19*g* are disabled, and the latched output signals MQ0–MQ3 of the latch circuits L11, L13, L15 and L17 are all unsettled.

After the supply voltage Vcc has become stable, the clock signal CK having a predetermined frequency and the low-level reset signal XR are provided. The voltage at the node J rises to a high level in accordance with the falling of the clock signal CK, and the voltage at the node K falls to a low level in accordance with the next rising of the clock signal CK in the power-ON detection circuit 460. Then, the power-ON detection signal L rises to a high level, and the power-ON detection signal M falls to a low level. As a result, the clamping of the select output signals Q0–Q3 by the power-ON detection signals L and M is released.

In accordance with the supply of the clock signal CK and the low-level reset signal XR, the latched output signals MQ0–MQ2 of the latch circuits L11, L13 and L15 are reset to low levels, and the latched output signal MQ3 of the latch circuit L17 is reset to a high level in the select signal generator 520.

After the reset signal XR returns to the high level, the latched output signals MQ0–MQ3 of the master stages sequentially rise to high levels in accordance with the falling of the clock signal CK, and the latched output signals SQ0–SQ3 sequentially fall to low levels in accordance with the rising of the clock signal CK. When the latched output signals SQ0–SQ3 fall, the select output signals Q0–Q3 sequentially rise to high levels.

The select signal generating circuit 14*a* of the third embodiment has the following advantages in addition to the advantages (1) to (3) of the second embodiment.

(1) When the complementary power-ON detection signals L and M are provided to the slave stage latch circuits L12, L14, L16 and L18 in accordance with the power-ON, the latched output signals SQ0–SQ3 are clamped, the select output signal Q3 is clamped to a high level, and the select output signals Q0–Q2 are clamped to low levels. Therefore, the select output signals Q0–Q3 are certainly clamped without any power-on restrictions.

Figure 12:
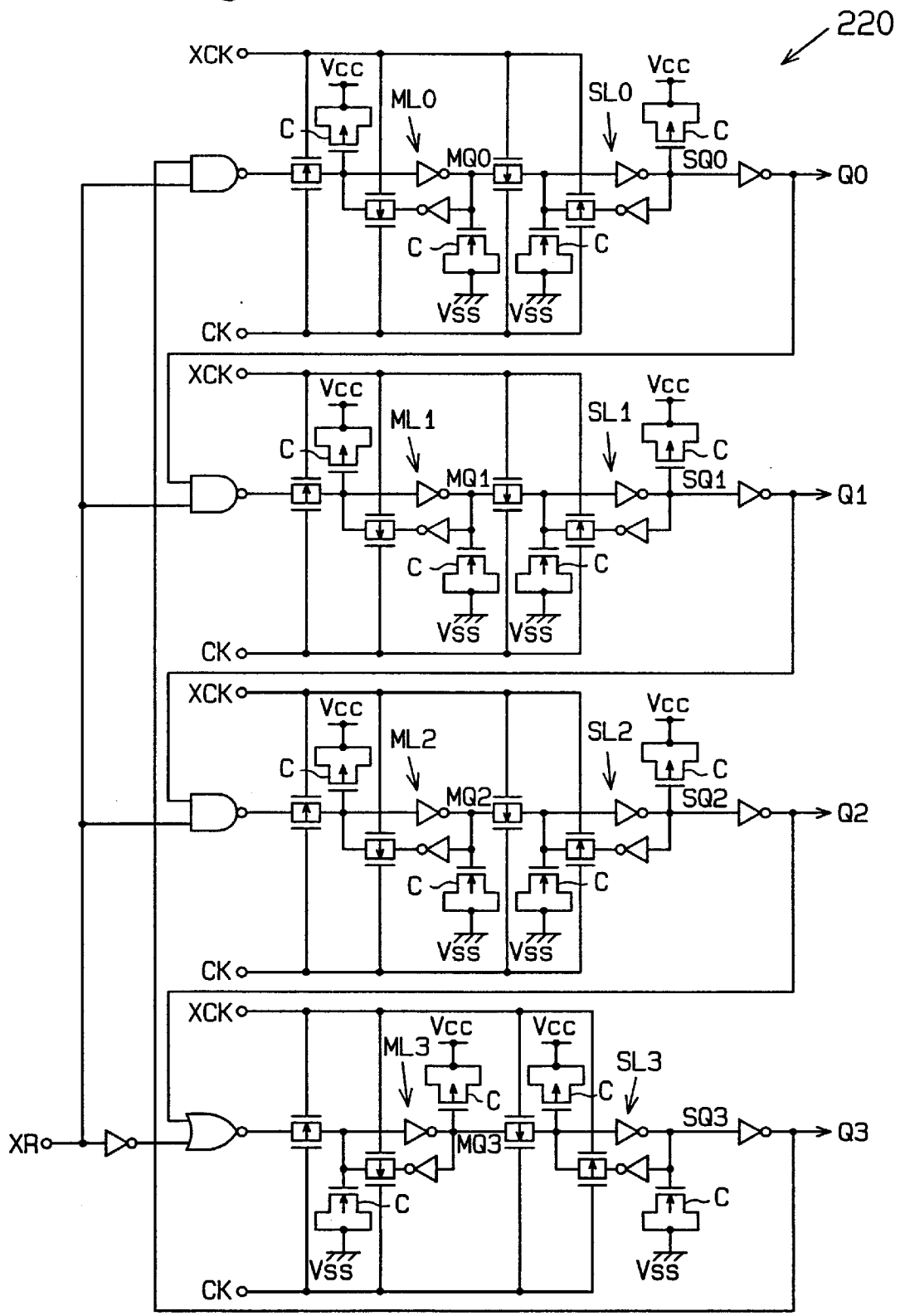
FIG. 12 is a schematic circuit diagram of a fourth shift register of the prior art.
Figure 13:
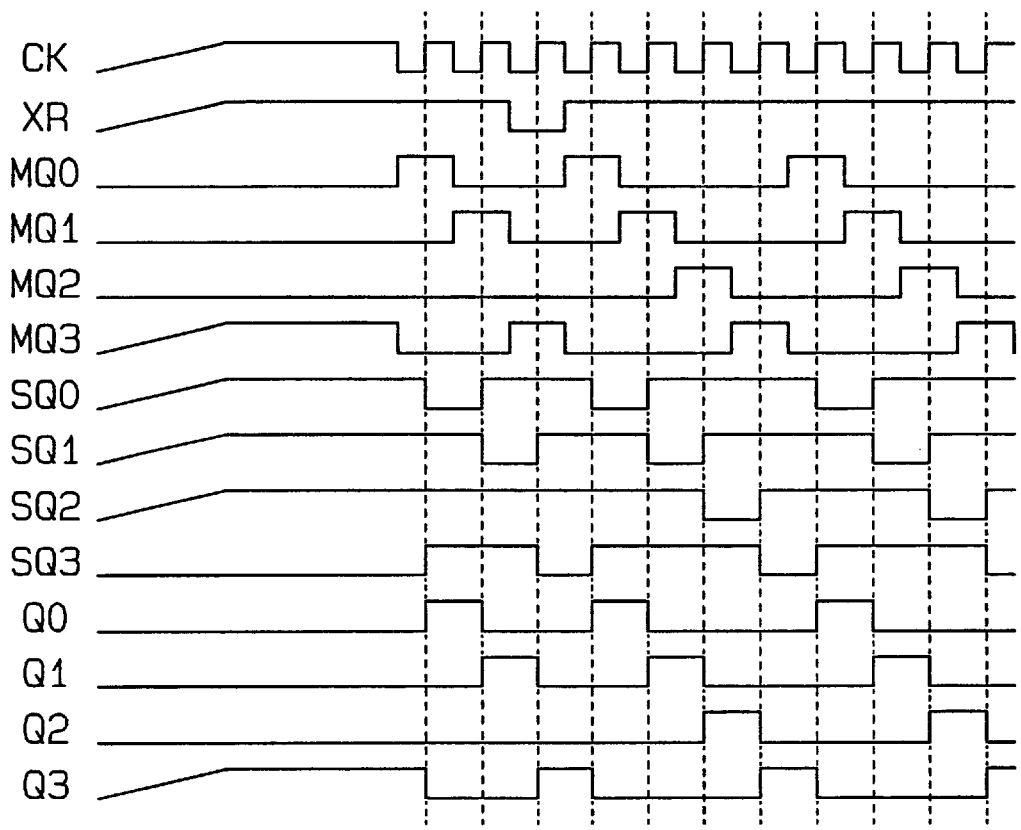
FIG. 13 is a timing chart illustrating the operation of the shift register of FIG. 12.
Figure 14:
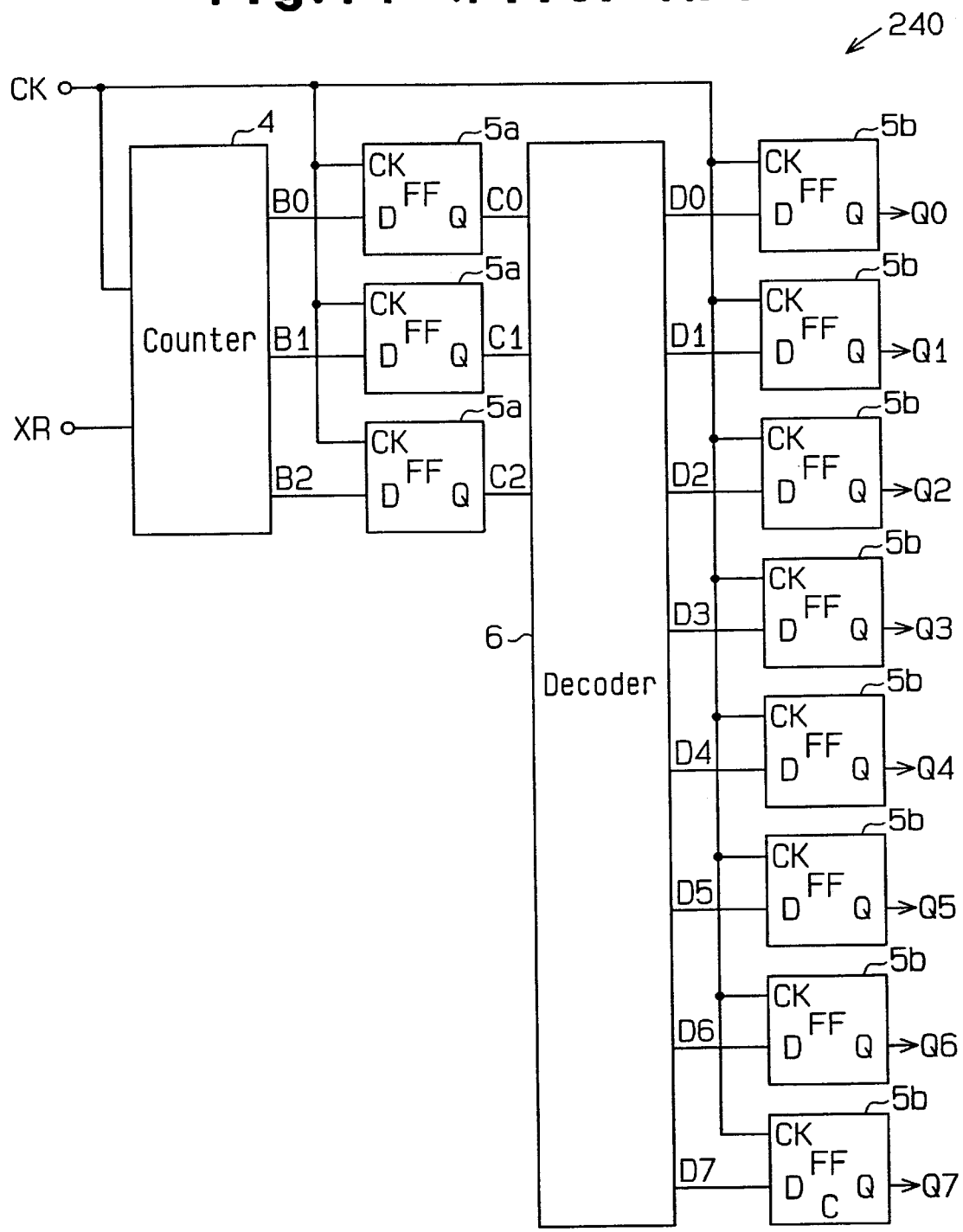
FIG. 14 is a schematic circuit diagram of a first pipeline processing circuit of the prior art.
Figure 15:
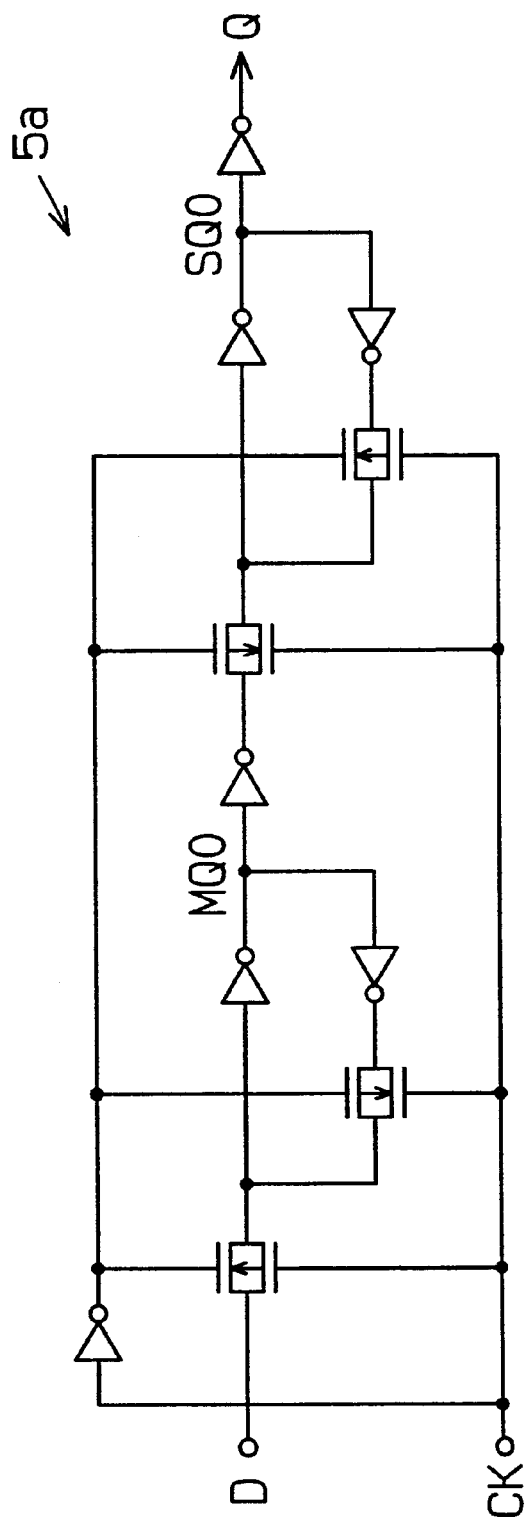
FIG. 15 is a schematic circuit diagram of a flip-flop circuit of the pipeline processing circuit of FIG. 14.
Figure 16:
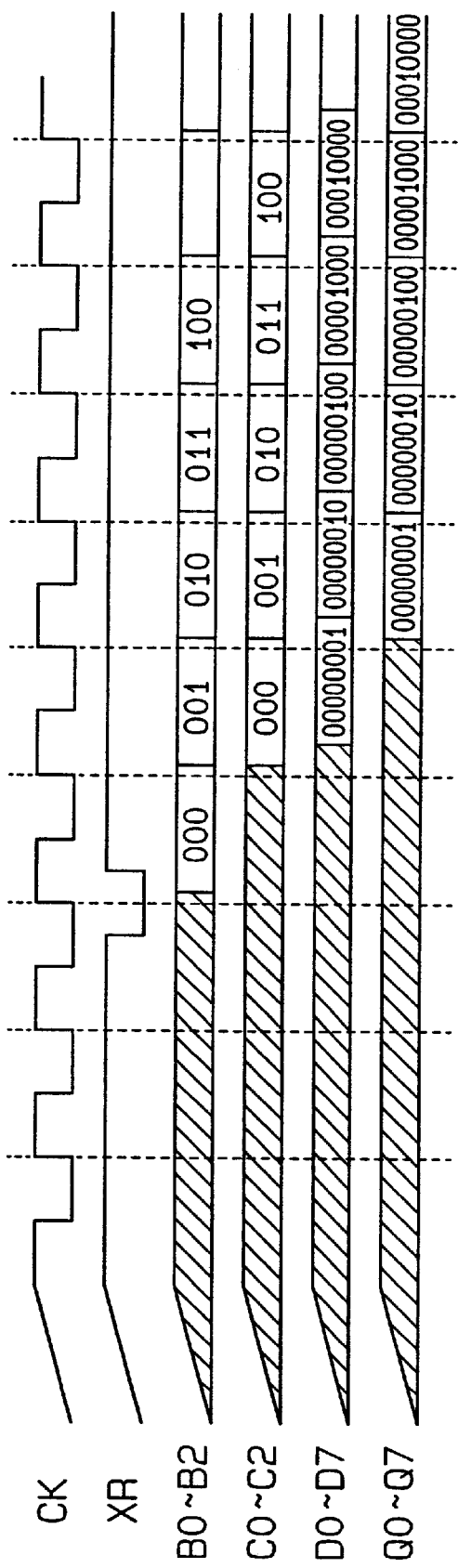
FIG. 16 is a timing chart illustrating the operation of the pipeline processing circuit of FIG. 14.
Figure 17:
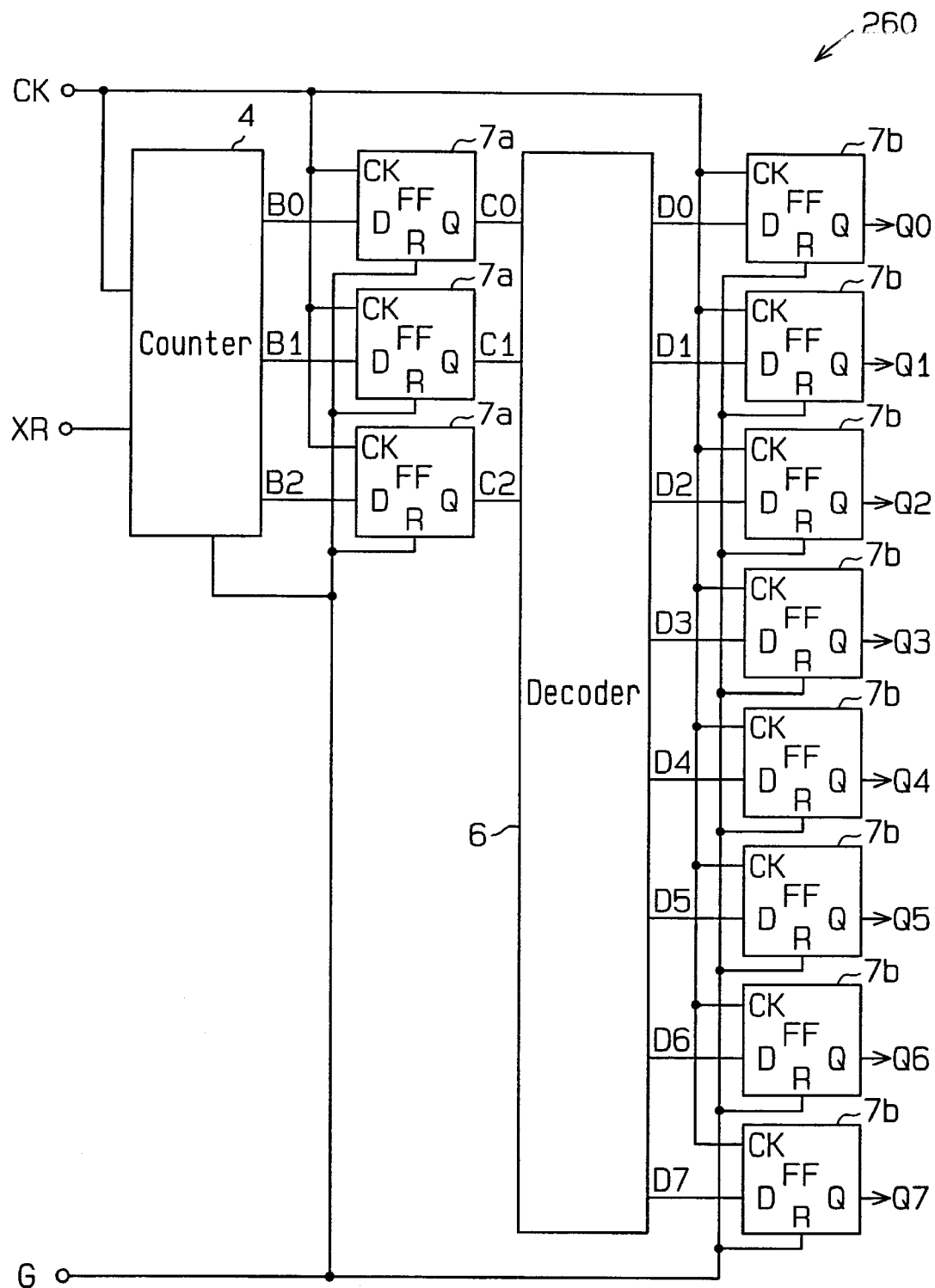
FIG. 17 is a schematic circuit diagram illustrating the operation of a second pipeline processing circuit of the prior art.
Figure 18:
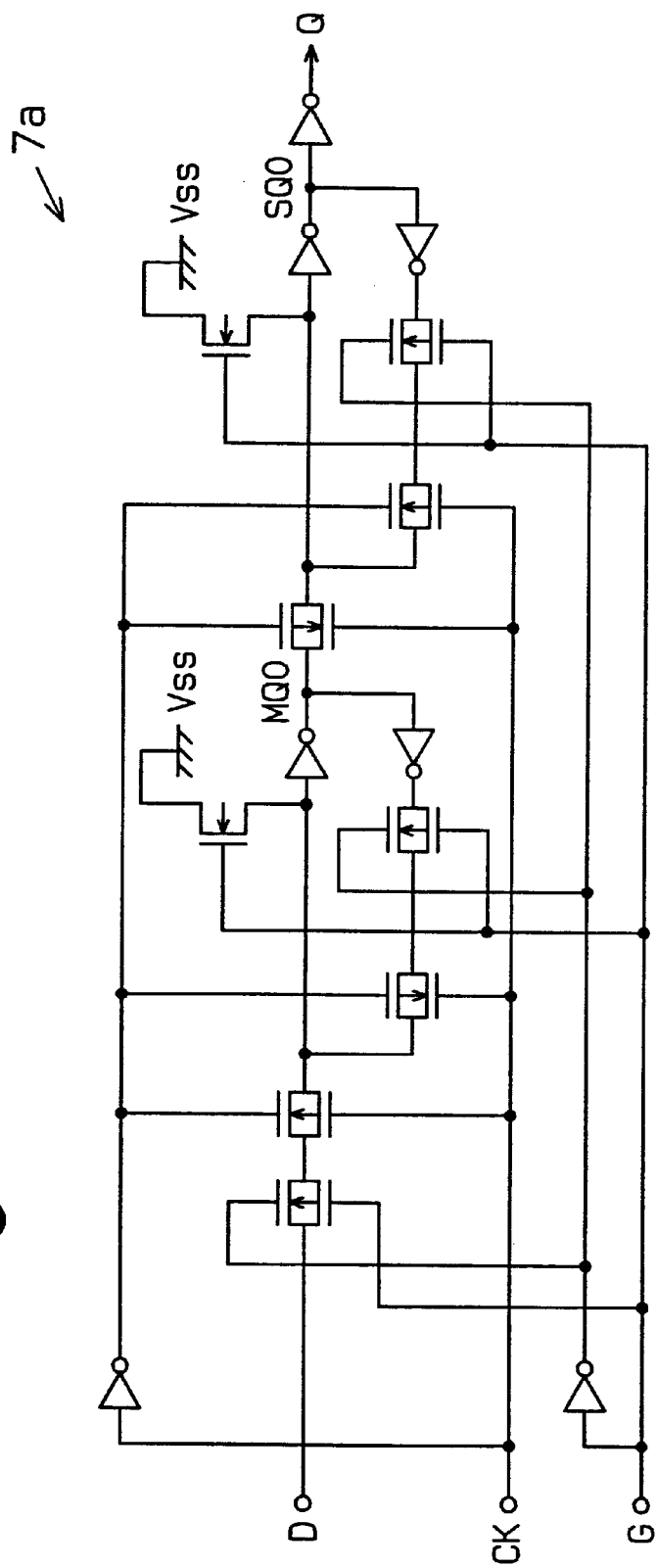
FIG. 18 is a schematic circuit diagram of a flip-flop circuit of the pipeline processing circuit of FIG. 17.
Figure 19:
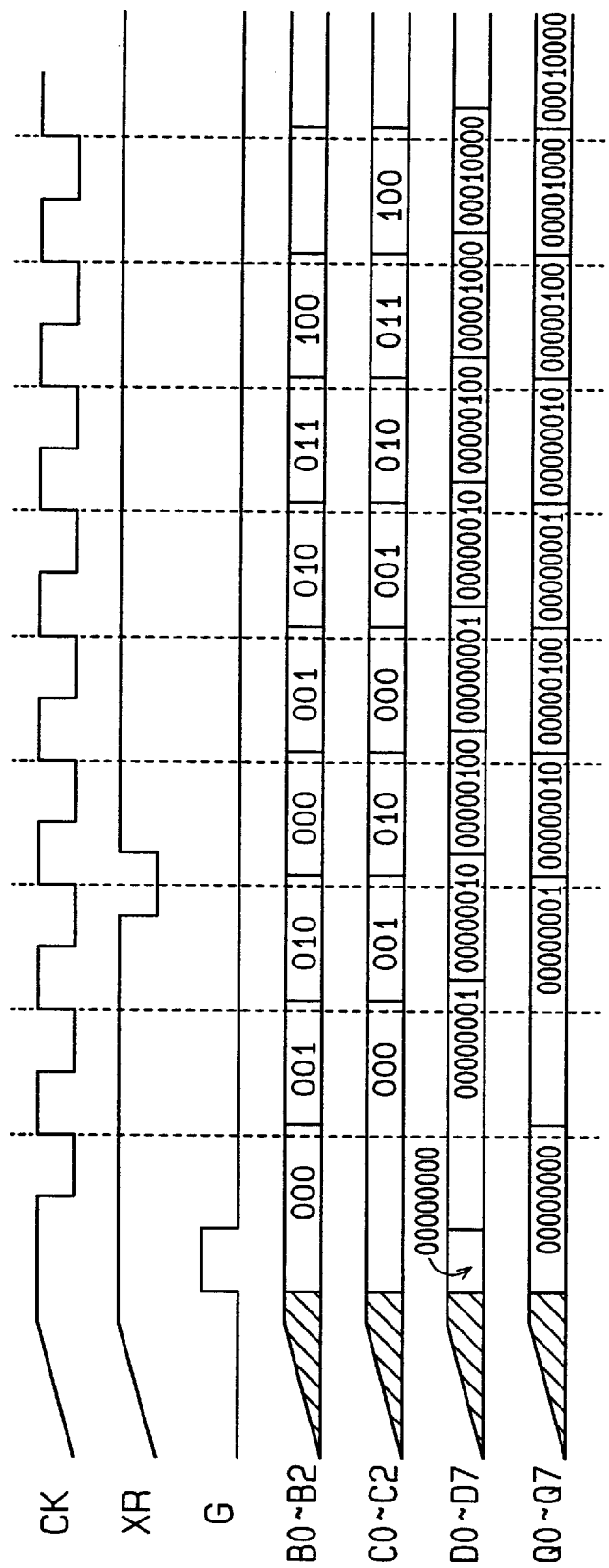
FIG. 19 is a timing chart illustrating the operation of the pipeline processing circuit of FIG. 17.

(2) The select signal generating circuit 14*a* does not need the capacitors, which are needed in the prior art in FIG. 12, and the number of necessary transfer gates is reduced to a half. This design prevents the circuit area of the select signal generating circuit 14*a* from increasing.

Figure 30:
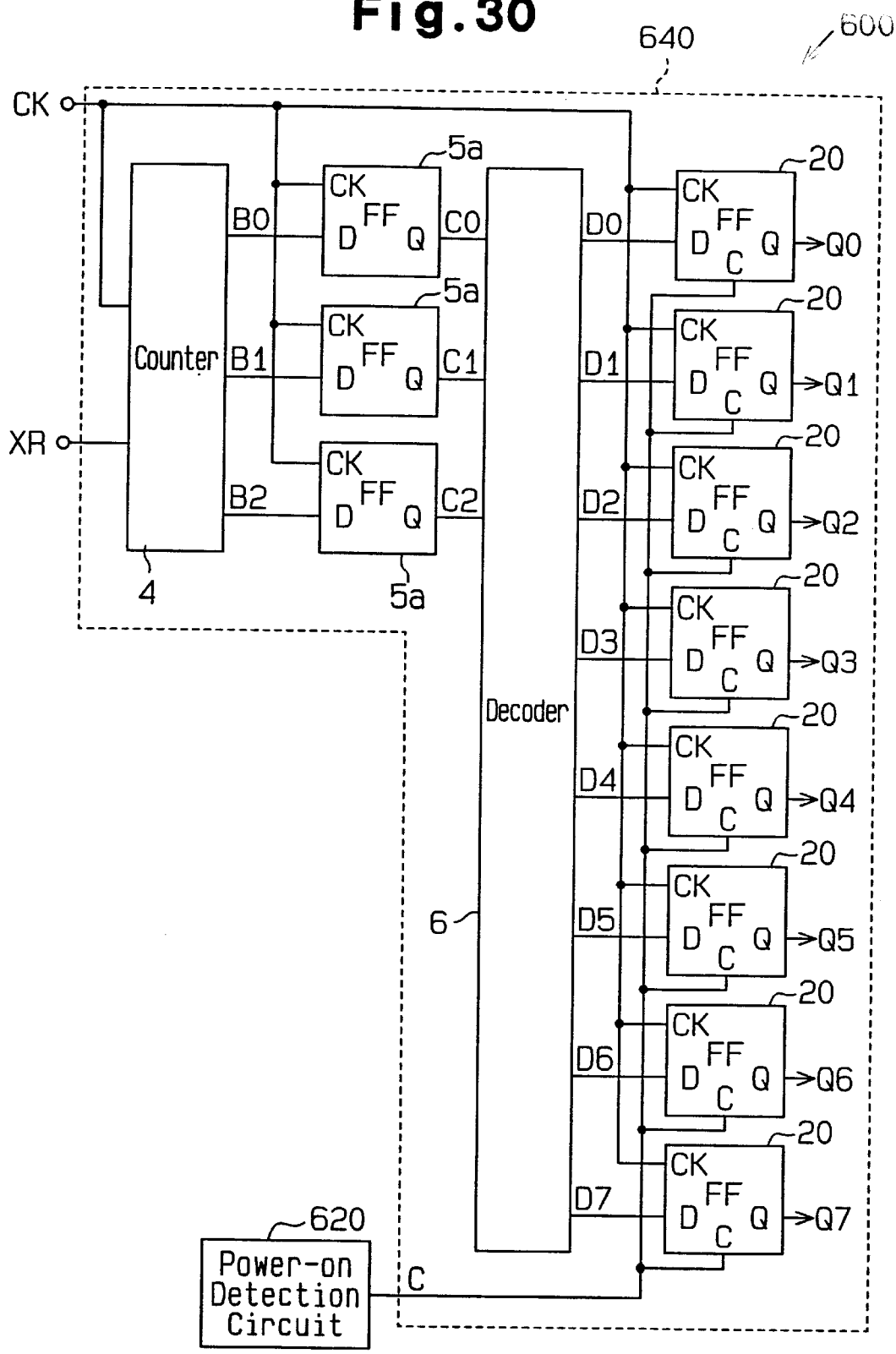
FIG. 30 is a schematic block diagram of a select signal generating circuit according to a fourth embodiment of the invention.

FIG. 30 is a schematic block diagram of a select signal generating circuit 600 according to a fourth embodiment of the present invention. The select signal generating circuit 600 operates as a pipeline processing circuit generating 8-bit select output signals Q0–Q7.

The select signal generating circuit 600 includes a power-ON detection circuit 620 and a select signal generator 640 including the counter 4, the flip-flop circuits 5a, the decoder 6 and eight flip-flop circuits 20.

The 8-bit decoded output signals D0–D7 of the decoder 6 are provided to the eight flip-flop circuits 20. The clock signal CK and a power-ON detection signal C from the power-ON detection circuit 620 are provided to each flip-flop circuit 20. The flip-flop circuits 20 output the select output signals Q0–Q7.

Figure 31:
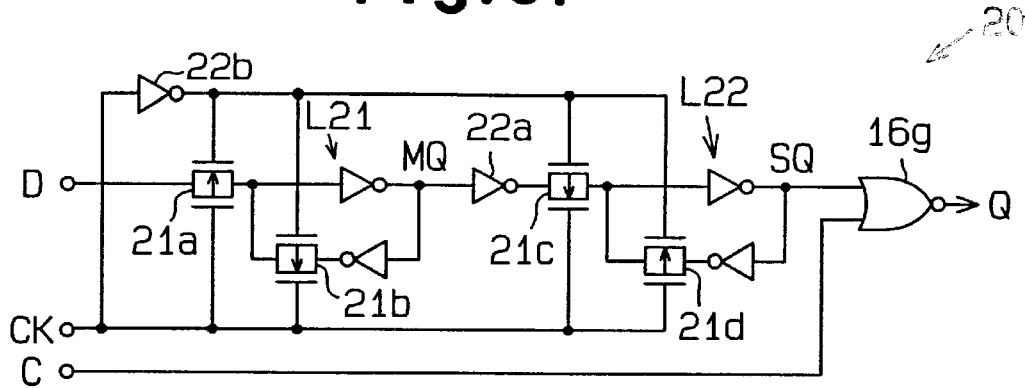
FIG. 31 is a schematic circuit diagram of a flip-flop circuit of the select signal generating circuit of FIG. 30.

FIG. 31 is a schematic circuit diagram of the flip-flop circuit 20. The decoded output signals D from the decoder 6 are provided to a master stage latch circuit L21 via a transfer gate 21a. The output signal of a feedback inverter circuit of the latch circuit L21 is fed back to the input terminal of the latch circuit L21 via a transfer gate 21b. A latched output signal MQ from the latch circuit L21 is provided to a slave stage latch circuit L22 via an inverter circuit 22a and a transfer gate 21c. The output signal of a feedback inverter circuit of the latch circuit L22 is fed back to the input terminal of the latch circuit L22 via a transfer gate 21d.

The clock signal CK is provided to the P channel gates of the transfer gates 21a and 21d and the N channel gates of the transfer gates 21b and 21c.

The clock signal CK is provided to the N channel gates of the transfer gates 21a and 21d and the P channel gates of the transfer gates 21b and 21c via an inverter circuit 22b.

The latched output signal SQ of the latch circuit L22 is provided to the first input terminal of a NOR circuit 16g, and the power-ON detection signal C is provided to the second input terminal of the NOR circuit 16g. The NOR circuit 16g outputs the select output signal Q from its output terminal. The NOR circuit 16g serves as a clamp circuit.

Figure 32:
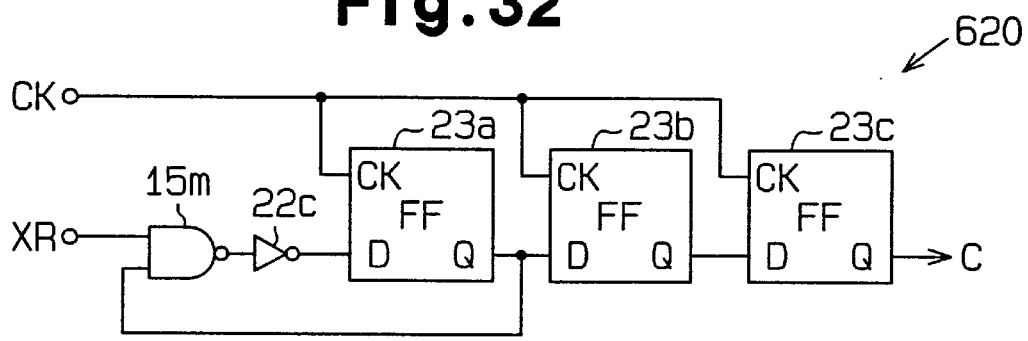
FIG. 32 is a schematic circuit diagram of a power-ON detection circuit of the select signal generating circuit in FIG. 30.

FIG. 32 is a schematic circuit diagram of the power-ON detection circuit 620.

The reset signal XR is provided to the first input terminal of a NAND circuit 15m whose output signal is provided to a flip-flop circuit 23a via an inverter circuit 22c. The output signal of the flip-flop circuit 23a is provided to the second input terminal of the NAND circuit 15m and a flip-flop circuit 23b. The output signal of the flip-flop circuit 23b is provided to a flip-flop circuit 23c. The flip-flop circuits 23a–23c are provided with the clock signal CK. The flip-flop circuit 23c outputs the power-ON detection signal C.

Figure 33:
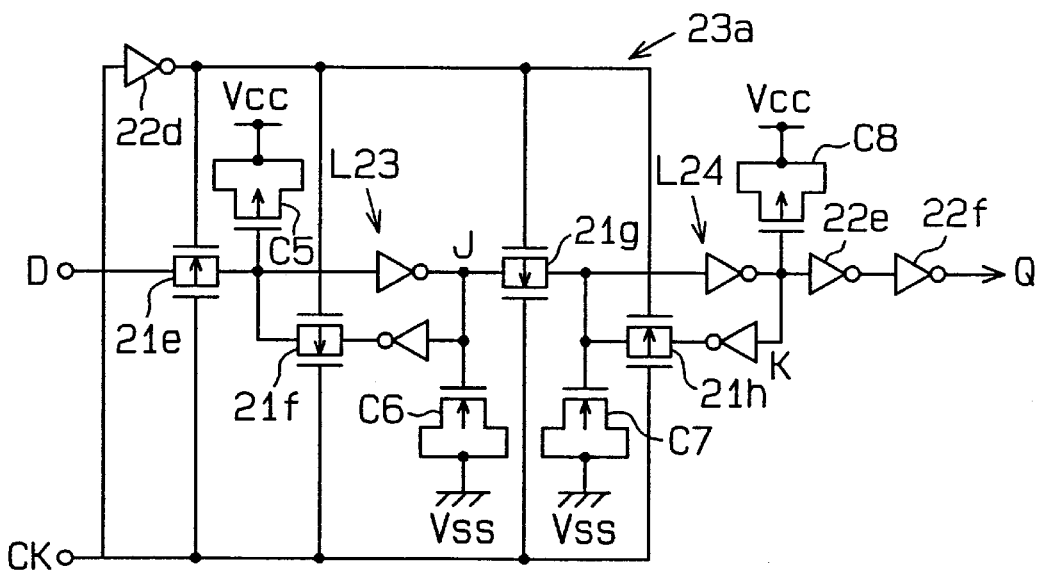
FIG. 33 is a schematic circuit diagram of a flip-flop circuit of the power-ON detection circuit of FIG. 32.

FIG. 33 is a schematic circuit diagram of the flip-flop circuit 23a. The flip-flop circuits 23b and 23c have the same structures as the flip-flop circuit 23a.

The input signal D is provided to a master stage latch circuit L23 via the transfer gate 21e. The output signal of a feedback inverter circuit of the latch circuit L23 is provided to the input terminal of the latch circuit L23 via a transfer gate 21f. The input terminal of the latch circuit L23 is connected to the power supply Vcc via a capacitor Cs, and the output terminal of the latch circuit L23 is connected to the power supply Vss via a capacitor C6.

The output signal of the latch circuit L23 is provided to a slave stage latch circuit L24 via a transfer gate 21g.

The output signal of a feedback inverter circuit of the latch circuit L24 is provided to the input terminal of the latch circuit L24 via a transfer gate 21h. The input terminal of the latch circuit L24 is connected to the power supply Vss via a capacitor C7, and the output terminal of the latch circuit L24 is connected to the power supply Vcc via a capacitor C8.

The clock signal CK is provided to the P channel gates of the transfer gates 21e and 21h, and the N channel gates of the transfer gates 21f and 21g. The clock signal CK is provided to the N channel gates of the transfer gates 21e and 21h and the P channel gates of the transfer gates 21f and 21g via an inverter circuit 22d. The latched output signal of the latch circuit L24 is output as a flip-flop output signal Q via inverter circuits 22e and 22f.

In the flip-flop circuits 23a–23c, when power is supplied from the supply voltages Vcc and Vss, the voltage at the input terminal of the latch circuit L23 rises to a high level, and the voltage at the output terminal of the latch circuit L23 drops to a low level. The voltage at the input terminal of the latch circuit L24 falls to a low level, and the voltage at the output terminal of the latch circuit L24 rises to a high level. Therefore, the flip-flop output signal Q rises to a high level.

Figure 34:
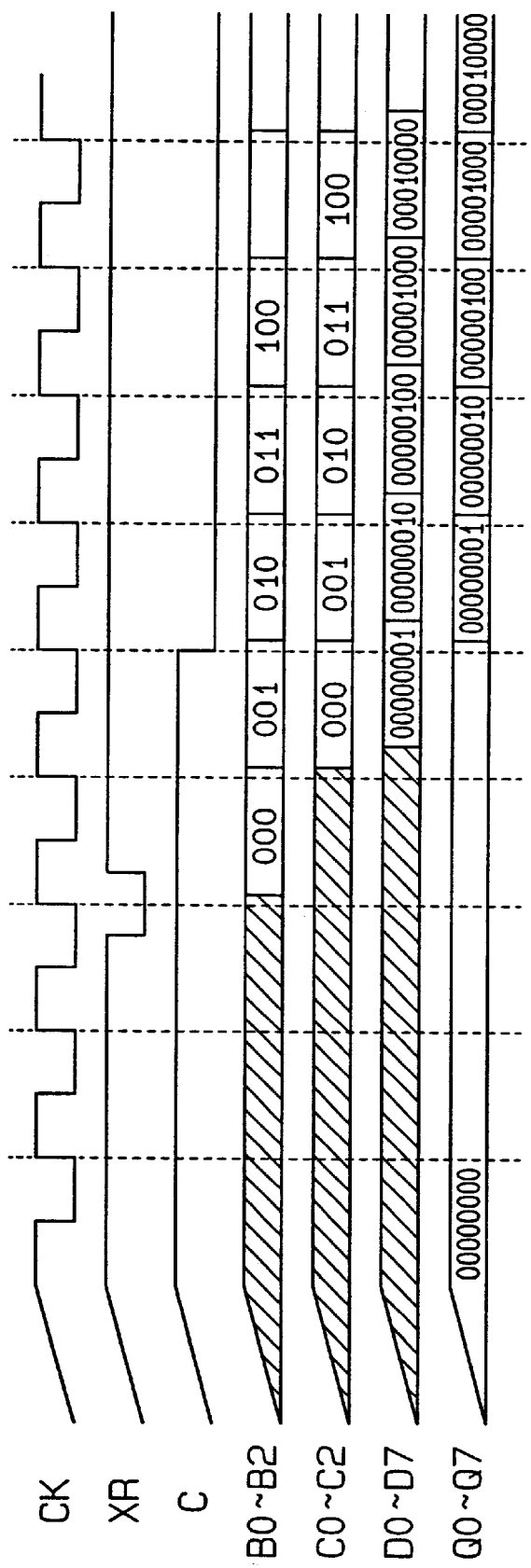
FIG. 34 is a timing chart illustrating the operation of the select signal generating circuit of FIG. 30.

FIG. 34 describes the operation of the select signal generating circuit 600.

As shown in FIG. 34, when power is supplied from the supply voltages Vcc and Vss, the power-ON detection signal C rises together with the supply voltage Vcc to a high level, and is maintained at the high level even after the clock signal CK is provided to the individual flip-flop circuits 23a–23c. With the low-level reset signal XR provided, the power-ON detection signal C falls to a low level after two clock periods pass since the rising of the clock signal CK.

The provision of power from the supply voltages Vcc and Vss causes the power-ON detection signal C to rise together with the supply voltage Vcc to a high level. The high-level power-on detection signal C is provided to the NOR circuit 16g of each flip-flop circuit 20 so that the select output signals Q0–Q7 are all clamped to "zero". In other words, all of the select output signals Q0–Q7 are clamped as non-select signals.

With the reset signal XR maintained at a high level according to the power-on, the counter 4 does not operate, and the counter output signals B0–B2 of the counter 4 are unsettled. The output signals C0–C2 of the flip-flop circuits 5a become unsettled, making the decoded output signals D0–D7 of the decoder 6 unsettled. At this time, even if the clock signal CK is provided to the power-ON detection circuit 620, the power-ON detection signal C is maintained at a high level, and the select output signals Q0–Q7 are all maintained at "zero".

When the low-level reset signal XR is provided, the counter 4 counts up the counter output signals B0–B2 every time the clock signal CK rises, and outputs the counter output signals B0–B2 of, for example, "000" first. Under this situation, when the clock signal CK rises, the flip-flop circuits 5a latch the counter output signals B0–B2 and send the latched output signals C0–C2 of "000" to the decoder 6. The decoder 6 decodes the latched output signals C0–C2 and outputs the decoded output signals D0–D7 of "00000001".

When the clock signal CK rises after the decoder 6 outputs the decoded output signals D0–D7 of "00000001" and two clock periods pass since the falling of the reset signal XR to the low level, the power-ON detection signal C falls to a low level. This unclamps the select output signals Q0–Q7 of the flip-flop circuits 20. In response to the next rising of the clock signal CK, the flip-flop circuits 20 latch the decoded output signals D0–D7 and outputs the select output signals Q0–Q7 "00000001". In this manner, every time the clock signal CK rises, the counter output signals B0–B2 are counted up and the select output signals Q0–Q7 are sequentially updated.

The select signal generating circuit 600 of the fourth embodiment has the following advantages.

(1) When power is provided from the supply voltages Vcc and Vss, the power-ON detection circuit 620 provides the power-ON detection signal C to the NOR circuits 16g of the flip-flop circuits 20 so that the select output signals Q0–Q7 of the flip-flop circuits 20 are all clamped to "zero". After the reset signal XR is provided, the select output signals Q0–Q7 are sequentially set to high levels in accordance with the clock signal CK. This prevents multiple selection of the main bus MB and the local buses LB, thus preventing the occurrence of a bus conflict.

(2) The use of the NOR circuit 16g at the last stage of each flip-flop circuit 20 does not affect the circuit area of the select signal generating circuit 600 much.

(3) There is not much influence of the use of the NOR circuit 16g on reduction in the operational speed of the select signal generating circuit 600.

(4) Since the select output signals Q0–Q7 are clamped based on the power-ON detection signal C maintained at a high level by the power-on, it is unnecessary to provide any power-on restrictions.

Although the select signal generating circuits 14, 14a and 600 of the second to fourth embodiments are adapted to the bus selection circuit 400, they may be adapted to a serial access memory 700 shown in FIG. 35.

The serial access memory 700 includes a plurality of memory cells 24 connected to a write circuit 25 and a read circuit 26, and select signal generating circuits 27 and 28. Each memory cell 24 is selected by one of select signals S10 to S1n generated by the select signal generating circuit 27 or one of select signals S20 to S2n generated by the select signal generating circuit 28. A writing operation or reading operation is performed on the selected memory cell 24.

The select signal generating circuits 27 and 28 may be the select signal generating circuit 14 or 14a or 600.

It should be apparent to those skilled in the art that the present invention may be embodied in many other specific forms without departing from the spirit or scope of the invention. Particularly, it should be understood that the invention may be embodied in the following forms.

In the second and third embodiments, one of the select output signals Q0–Q2 may be clamped to a high level instead of only the select output signal Q3 being clamped upon power on.

The select signal generating circuits of the second and third embodiments may be modified so as to generate select signals of four or more bits.

Therefore, the present examples and embodiments are to be considered as illustrative and not restrictive and the invention is not to be limited to the details given herein, but may be modified within the scope and equivalence of the appended claims.

What is claimed is:

1. A select signal generating circuit comprising:
   a select signal generator for generating a plurality of select output signals in accordance with a clock signal in response to a reset signal; and
   a power-ON detection circuit for detecting the power-on, generating a power-ON detection signal and maintaining the power-ON detection signal until the reset signal is provided, wherein the select signal generator includes a clamp circuit connected to the power-ON detection circuit for clamping the plurality of select output signals to predetermined levels in response to the power-ON detection signal.

2. The select signal generating circuit according to claim 1, wherein the select signal generator includes a plurality of flip-flop circuits connected in a ring form, each of the flip-flop circuits including a master stage latch circuit and a slave stage latch circuit for generating an associated select output signal, and wherein the clamp circuit is connected to an output of the slave stage latch circuit of each flip-flop circuit.

3. The select signal generating circuit according to claim 2, wherein the plurality of select output signals includes a select signal and a non-select signal, and wherein the plurality of flip-flop circuits includes a first flip-flop circuit for generating the select signal and a second flip-flop circuit for generating the non-select signal, and wherein the clamp circuit includes:
   a NAND circuit for receiving the select signal from the first flip-flop circuit and the power-ON detection signal and generating a clamped select signal; and
   a NOR circuit for receiving the non-select signal from the second flip-flop circuit and the power-ON detection signal and generating a clamped non-select signal.

4. The select signal generating circuit according to claim 1, wherein the select signal generator includes:
   a counter for performing a count operation and generating a plurality of counter output signals in accordance with the clock signal in response to the reset signal;
   a first plurality of flip-flop circuits connected to the counter for receiving the plurality of counter output signals and generating a plurality of flip-flop output signals;
   a decoder connected to the first plurality of flip-flop circuits for decoding the plurality of flip-flop output signals and generating a plurality of decoded output signals; and
   a second plurality of flip-flop circuits connected to the decoder for receiving the plurality of decoded output signals and generating a plurality of select output signals, wherein
   the clamp circuit is provided at an output stage of each of the second plurality of flip-flop circuits.

5. The select signal generating circuit according to claim 4, wherein the clamp circuit clamps the plurality of select output signals as non-select signals indicative of a non-selected state.

6. The select signal generating circuit according to claim 4, wherein the power-ON detection circuit includes a plurality of flip-flop circuits connected in series for maintaining the power-ON detection signal for a predetermined time after providing of the reset signal, each flip-flop circuit including:
   a master stage latch circuit having a first input terminal and a first output terminal;
   a slave stage latch circuit connected to the master stage latch circuit and having a second input terminal and a second output terminal;
   a first capacitor connected between the first input terminal of the master stage latch circuit and a high-potential power supply;
   a second capacitor connected between the first output terminal of the master stage latch circuit and a low-potential power supply;
   a third capacitor connected between the second input terminal of the slave stage latch circuit and the low-potential power supply; and
   a fourth capacitor connected between the second output terminal of the slave stage latch circuit and the high-potential power supply.

7. The select signal generating circuit according to claim 1, wherein the power-ON detection circuit includes:
- a master stage latch circuit having a first input terminal and a first output terminal;
- a slave stage latch circuit connected to the master stage latch circuit and having a second input terminal and a second output terminal;
- a first capacitor connected between the first input terminal of the master stage latch circuit and a high-potential power supply;
- a second capacitor connected between the first output terminal of the master stage latch circuit and a low-potential power supply;
- a third capacitor connected between the second input terminal of the slave stage latch circuit and the low-potential power supply; and
- a fourth capacitor connected between the second output terminal of the slave stage latch circuit and the high-potential power supply.

8. The select signal generating circuit according to claim 1, wherein the plurality of select output signals includes a select signal and a non-select signal, and wherein the select signal generator includes a first flip-flop circuit for generating the select signal and a second flip-flop circuit for generating the non-select signal, the first and second flip-flop circuits being connected in a ring form, and wherein the first flip-flop circuit includes a first master stage latch circuit and a first slave latch circuit connected to the first master stage latch circuit for generating the non-select signal, the first slave stage latch circuit including:
- a forward NAND circuit for serving as the clamp circuit for clamping the non-select signal in response to the power-ON detection signal, and
- a feedback inverter circuit connected to the forward NAND circuit and disabled by the power-ON detection signal, the second flip-flop circuit including a second master stage latch circuit and a second slave stage latch circuit connected to the second master stage latch circuit for generating the select signal, the second slave stage latch circuit including:
- a forward NOR circuit for serving as the clamp circuit for clamping the select signal in response to the power-ON detection signal, and
- a feedback inverter circuit connected to the forward NOR circuit and disabled by the power-ON detection signal.

9. A select signal generating circuit comprising:
- a select signal generator for generating a plurality of select output signals in accordance with a clock signal in response to a reset signal; and
- a power-ON detection circuit for detecting the power-on, generating a first power-ON detection signal having a first level, and generating a second power-ON detection signal having a second level in response to the reset signal, wherein the select signal generator includes a clamp circuit connected to the power-ON detection circuit for clamping the plurality of select output signals to predetermined levels in response to the first power-ON detection signal and unclamping the plurality of select output signals in response to the second power-ON detection signal.

10. A bus selection circuit connected to a plurality of bus lines, comprising:
- a selection circuit for selecting one of the plurality of bus lines in accordance with a plurality of select output signals; and
- a select signal generating circuit connected to the selection circuit, the select signal generating circuit including,
  - a select signal generator for generating the plurality of select output signals in accordance with a clock signal in response to a reset signal, and
  - a power-ON detection circuit for detecting the power-on, generating a power-ON detection signal and maintaining the power-ON detection signal until the reset signal is provided, wherein the select signal generator includes a clamp circuit connected to the power-ON detection circuit for clamping the plurality of select output signals to predetermined levels in response to the power-ON detection signal.

11. A memory comprising:
- a plurality of memory cells; and
- a select signal generating circuit for selecting one of the plurality of memory cells, the select signal generating circuit including,
  - a select signal generator for generating the plurality of select output signals for the plurality of memory cells in accordance with a clock signal in response to a reset signal, and
  - a power-ON detection circuit for detecting the power-on, generating a power-ON detection signal and maintaining the power-ON detection signal until the reset signal is provided, wherein the select signal generator includes a clamp circuit connected to the power-ON detection circuit for clamping the plurality of select output signals to predetermined levels in response to the power-ON detection signal.

* * * * *